(12) United States Patent
Jiang et al.

(10) Patent No.: US 9,748,264 B1
(45) Date of Patent: Aug. 29, 2017

(54) SEMICONDUCTOR STRUCTURE AND MANUFACTURING METHOD THEREOF

(71) Applicant: Macronix International Co., Ltd., Hsinchu (TW)

(72) Inventors: Yu Wei Jiang, Hsinchu (TW); Teng Hao Yeh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 15/148,485

(22) Filed: May 6, 2016

Related U.S. Application Data

(63) Continuation-in-part of application No. 15/085,102, filed on Mar. 30, 2016, now abandoned.

(51) Int. Cl.
| | | |
|---|---|---|
| *H01L 29/74* | (2006.01) |
| *H01L 29/80* | (2006.01) |
| *H01L 29/76* | (2006.01) |
| *H01L 21/00* | (2006.01) |
| *H01L 21/338* | (2006.01) |
| *H01L 21/8238* | (2006.01) |
| *H01L 21/336* | (2006.01) |
| *H01L 27/11582* | (2017.01) |
| *H01L 29/04* | (2006.01) |
| *H01L 29/16* | (2006.01) |
| *H01L 23/528* | (2006.01) |

(Continued)

(52) U.S. Cl.
CPC .. *H01L 27/11582* (2013.01); *H01L 21/02532* (2013.01); *H01L 21/02595* (2013.01); *H01L 21/28282* (2013.01); *H01L 21/30604* (2013.01); *H01L 21/30625* (2013.01); *H01L 21/31111* (2013.01); *H01L 21/32133* (2013.01); *H01L 21/76224* (2013.01); *H01L 23/528* (2013.01); *H01L 27/11565* (2013.01); *H01L 29/04* (2013.01); *H01L 29/0649* (2013.01); *H01L 29/16* (2013.01); *H01L 29/66545* (2013.01)

(58) Field of Classification Search
CPC ............ H01L 29/7827; H01L 29/7926; H01L 29/785; H01L 29/66795; H01L 27/2454; H01L 27/10864
USPC ........ 257/220, 263, 302; 438/156, 173, 212, 438/268
See application file for complete search history.

(56) References Cited

U.S. PATENT DOCUMENTS

2012/0068247 A1* 3/2012 Lee .................. H01L 27/11551
257/316

* cited by examiner

*Primary Examiner* — Hsien Ming Lee
(74) *Attorney, Agent, or Firm* — Fish & Richardson P.C.

(57) ABSTRACT

A semiconductor structure and a manufacturing method are provided. The semiconductor structure includes a substrate, conductive layers, insulating layers, a memory structure including first memory structure clusters and second memory structure clusters, isolation trenches, and common source trenches. The conductive layers and the insulating layers are interlaced and stacked on the substrate. Each first memory structure cluster include first memory structures and each first memory structure cluster include second memory structures. The first and second memory structures penetrate the conductive layers and the insulating layers. Each isolation trench is formed between a first memory structure cluster and a second memory structure cluster. The isolation trenches span horizontally on the substrate in a discontinuous manner separated by gaps. Common source trenches are formed on the substrate that run substantially parallel with the isolation trenches.

18 Claims, 29 Drawing Sheets

(51) Int. Cl.
*H01L 29/06* (2006.01)
*H01L 29/66* (2006.01)
*H01L 27/11565* (2017.01)
*H01L 21/762* (2006.01)
*H01L 21/3213* (2006.01)
*H01L 21/28* (2006.01)
*H01L 21/02* (2006.01)
*H01L 21/311* (2006.01)
*H01L 21/306* (2006.01)

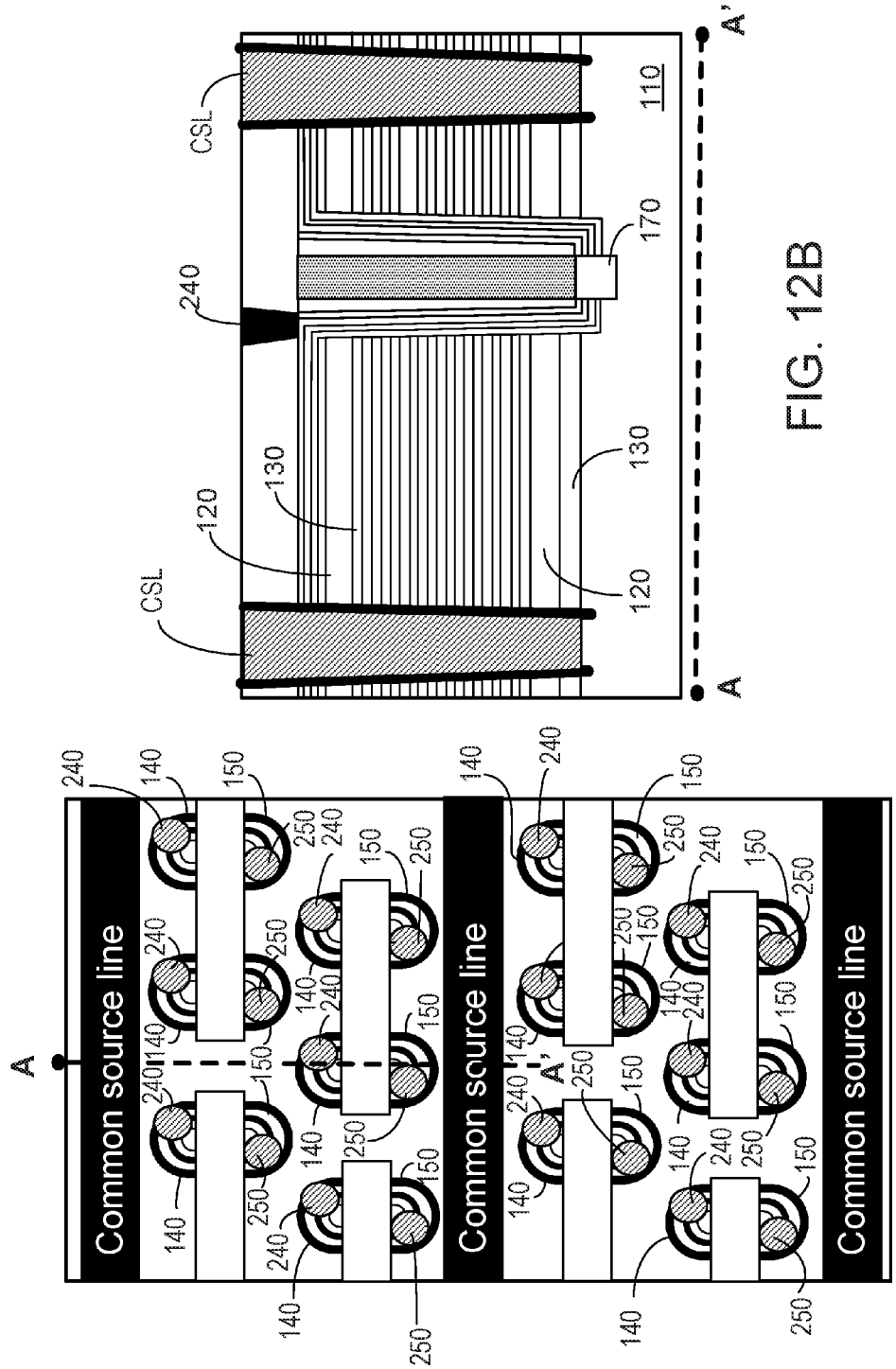

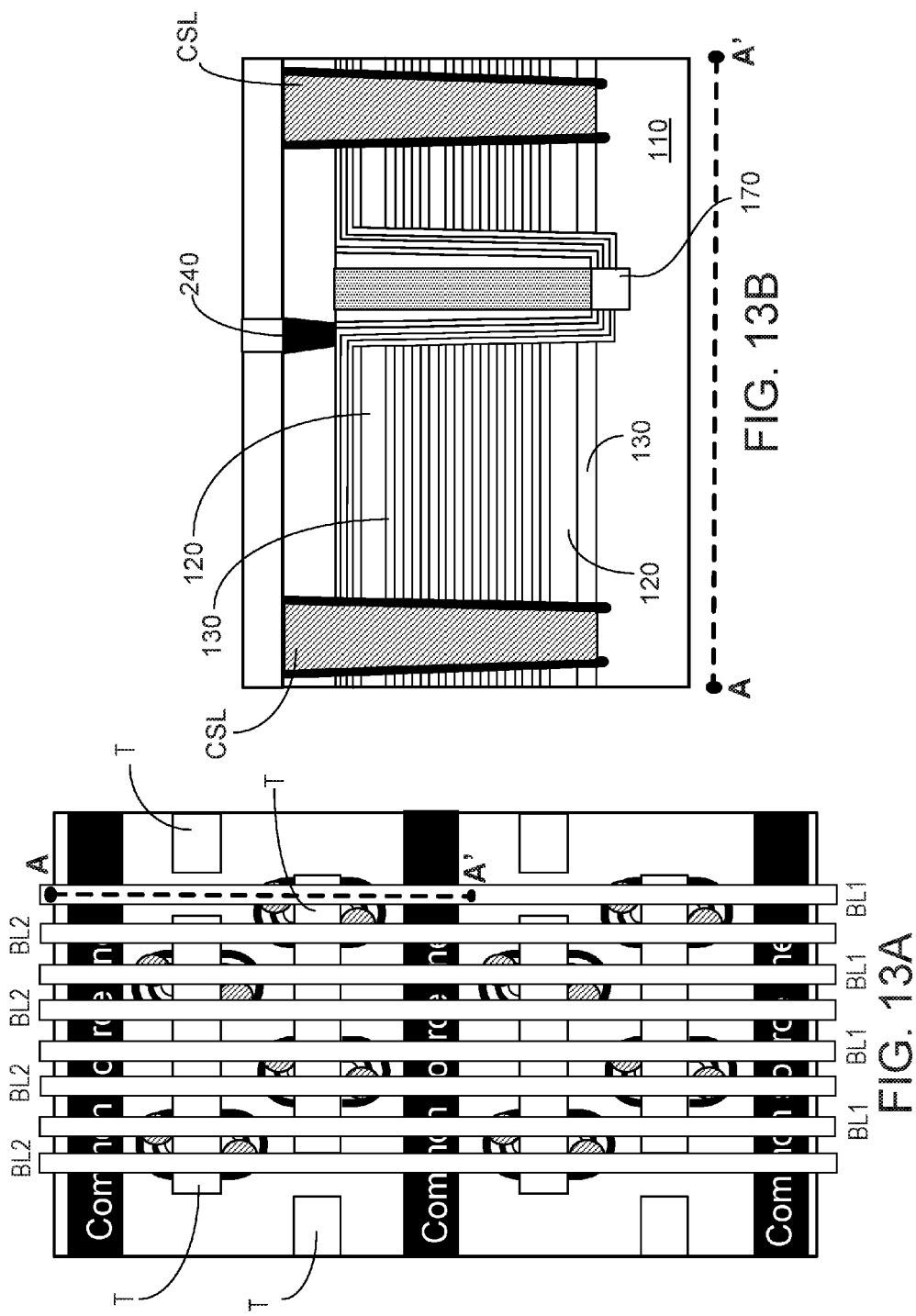

SEMICONDUCTOR STRUCTURE AND MANUFACTURING METHOD THEREOF

CROSS REFERENCE TO RELATED APPLICATIONS

This application claims the benefit of and is a continuation-in-part of U.S. patent application Ser. No. 15/085,102, filed Mar. 30, 2016, the entire contents of which are hereby incorporated by reference.

BACKGROUND

Technical Field

The disclosure relates in general to a semiconductor structure and a manufacturing method thereof, and particularly to a semiconductor structure with a high memory density and a manufacturing method thereof.

Description of the Related Art

In recent years, the structures of semiconductor devices have been changed constantly, and the storage capacity of the devices has been increased continuously. Memory devices are used in storage elements for many products such as MP3 players, digital cameras, computer files, etc. As the application increases, the demand for the memory device focuses on small size and large memory capacity. For satisfying the requirement, a memory device having a high element density and a small size and the manufacturing method thereof are in need.

As such, it is desirable to develop a three-dimensional (3D) memory device with larger number of multiple stacked planes to achieve greater storage capacity, improved qualities, all the while remaining in a small size.

SUMMARY

The disclosure relates in general to a semiconductor structure and a manufacturing method thereof. In the semiconductor structure of the disclosure, a pair of vertical memory structures both have horizontal C shaped cross-sections and are separated from each other by an isolation trench; accordingly, the memory density in a unit area is increased, and hence a greater memory storage capacity is achieved.

In one aspect, some implementations provide a semiconductor structure that includes: a substrate; a plurality of conductive layers and a plurality of insulating layers formed on the substrate, wherein the conductive layers and the insulating layers are interlaced and stacked on the substrate; a structure comprising: a first group of memory structure clusters and a second group of memory structure clusters, formed on the substrate and through the conductive layers and the insulating layers, each of the first group of memory structure cluster including a plurality of first memory structures, each first memory structure having a first cross-section shape, each of the second group of memory structure cluster including a plurality of second memory structures, each second memory structure having a second cross-section shape, the first cross-section shape and the second cross-section shape complementing each other; and a plurality of isolation trenches formed on the substrate, each isolation trench disposed between a particular first memory structure cluster and a particular second memory structure cluster such that neighboring isolation trenches on the substrate are separated by a gap that is aligned with an axial direction of the neighboring trenches.

Implementations may include one or more of the following features.

The semiconductor structure may include a plurality of common source trenches formed on the substrate that run substantially parallel with the isolation trenches. The conductive layers may include replacement gates with a conducting metal fill-in. The semiconductor structure may include epitaxial structures, each particular epitaxial structure formed vertically between a particular isolation trench and the substrate such that a corresponding first memory structure and a corresponding second memory structure may be electrically connected to the substrate via the particular epitaxial structure. Each of the first memory structures and each of the second memory structures may respectively include: (i) a memory structure layer that may include: a blocking layer formed on the conductive layers; a memory storage layer formed on the blocking layer; and a tunneling layer formed on the memory storage layer; and (ii) a channel layer formed on the memory structure layer, wherein the channel layer may be a polysilicon layer. Each memory structure cluster may be a vertical memory structure cluster that may include one to four memory structures, and wherein each memory structure may be a vertical memory structure. Each first memory structure cluster may have a C-shaped cross section, wherein each first memory structure cluster and a particular second memory structure cluster may be bilaterally symmetric with respect to a particular isolation trench, wherein each second memory structure cluster may have a C-shaped cross section, and wherein each second memory structure cluster and a particular first memory structure cluster may be bilaterally symmetric with respect to a particular isolation trench.

The semiconductor structure may include: first contact structures, each electrically connected to a particular first memory structure; and second contact structures, each electrically connected to a particular second memory structure. The semiconductor structure may include: a first bit line electrically connected to the first contact structure; a second bit line electrically connected to the second contact structure; wherein the first bit line and the second bit line may be substantially parallel to each other while the first bit line and the second bit line may be substantially orthogonal to the common source trenches. The first bit lines may be electrically coupled to the common source trenches while the second bit lines may be electrically coupled to the common source trenches.

In another aspect, some implementations provide a manufacturing method that includes: forming a plurality of conductive layers and a plurality of insulating layers on a substrate, wherein the conductive layers and the insulating layers are interlaced and stacked on the substrate; forming a structure comprising: a first group of memory structure clusters and a second group of memory structure clusters, each being formed on the substrate and through the conductive layers and the insulating layers, each of the first memory structure cluster including more than one first memory structures, each first memory structure having a first cross-section shape, each of the second memory structure cluster including more than one second memory structures, each second memory structure having a second cross-section shape, the first cross-section shape and the second cross-section shape complementing each other; and forming a plurality of isolation trenches on the substrate, each isolation trench disposed between one particular first memory structure cluster and one particular second memory structure cluster such that neighboring isolation trenches on the substrate are separated by gaps that is aligned with an axial direction of the neighboring trenches.

Implementations may include one or more of the following features.

The manufacturing method may include: forming a plurality of common source trenches on the substrate that run substantially parallel with the isolation trenches, etching the conductive layers to form a space and filling the etched space with a conducting metal. The manufacturing method may include: forming epitaxial structures, each particular epitaxial structure being formed vertically between a particular isolation trench and the substrate such that a corresponding first memory structure and a corresponding second memory structure are electrically connected to the substrate via the particular epitaxial structure. Forming the first memory structures, the second memory structures, and the isolation trenches may include: forming a recess with an elliptical cross-section, the recess penetrating the conductive layers and the insulating layers as deep as the substrate; forming a memory structure material layer in the recess; forming a channel material layer on the memory structure material layer; forming an oxide material layer on the channel material layer to fill in the recess, the oxide material layer having an air gap; removing a portion of the conductive layers, a portion of the isolating layers, a portion of the memory structure material layer, a portion of the channel material layer, and a portion of the oxide material layer for forming a trench space; and filling the trench space with an isolation material such that the isolation trench may be formed. Forming the trench space may include: etching to remove the portion of the conductive layers, the portion of the isolating layers, the portion of the memory structure material layer, the portion of the channel material layer, and the portion of the oxide material layer such that the portion of the memory structure material layer, the portion of the channel material layer, and the portion of the oxide material layer in the recess may be removed to expose the substrate, and the portion of the conductive layers and the portion of the isolating layers may be removed to expose a bottommost layer of the isolating layers.

The manufacturing method of the semiconductor structure may include: forming epitaxial structures, each particular epitaxial structure being formed vertically between a particular isolation trench and the substrate such that a corresponding first memory structure and a corresponding second memory structure may be electrically connected to the substrate via the particular epitaxial structure. The manufacturing method may include: removing the channel material layer exposed outside the trench space by a chemical mechanical polishing (CMP) process.

The manufacturing method may include: forming first contact structures, each electrically connected to a particular first memory structure; and forming second contact structures, each electrically connected to a particular second memory structure. The manufacturing method may include: forming a first bit line electrically connected to the first contact structure; and forming a second bit line electrically connected to the second contact structure, wherein the first bit line and the second bit line may be substantially parallel to each other while the first bit line and the second bit line may be substantially orthogonal to the common source trenches.

The above and other aspects of the disclosure will become better understood with regard to the following detailed description of the non-limiting embodiment(s). The following description is made with reference to the accompanying drawings.

BRIEF DESCRIPTION OF THE DRAWINGS

FIGS. 3A-3B, 4A-4B, 5A-5C, 6A-6E, 7A-7E, 8A-8E, 9A-9E, 10A-10B, 11A-11B, 12A-12B and 13A-13B illustrate a process for manufacturing a semiconductor structure according to an embodiment of the present disclosure.

DETAILED DESCRIPTION

Figure 1A:
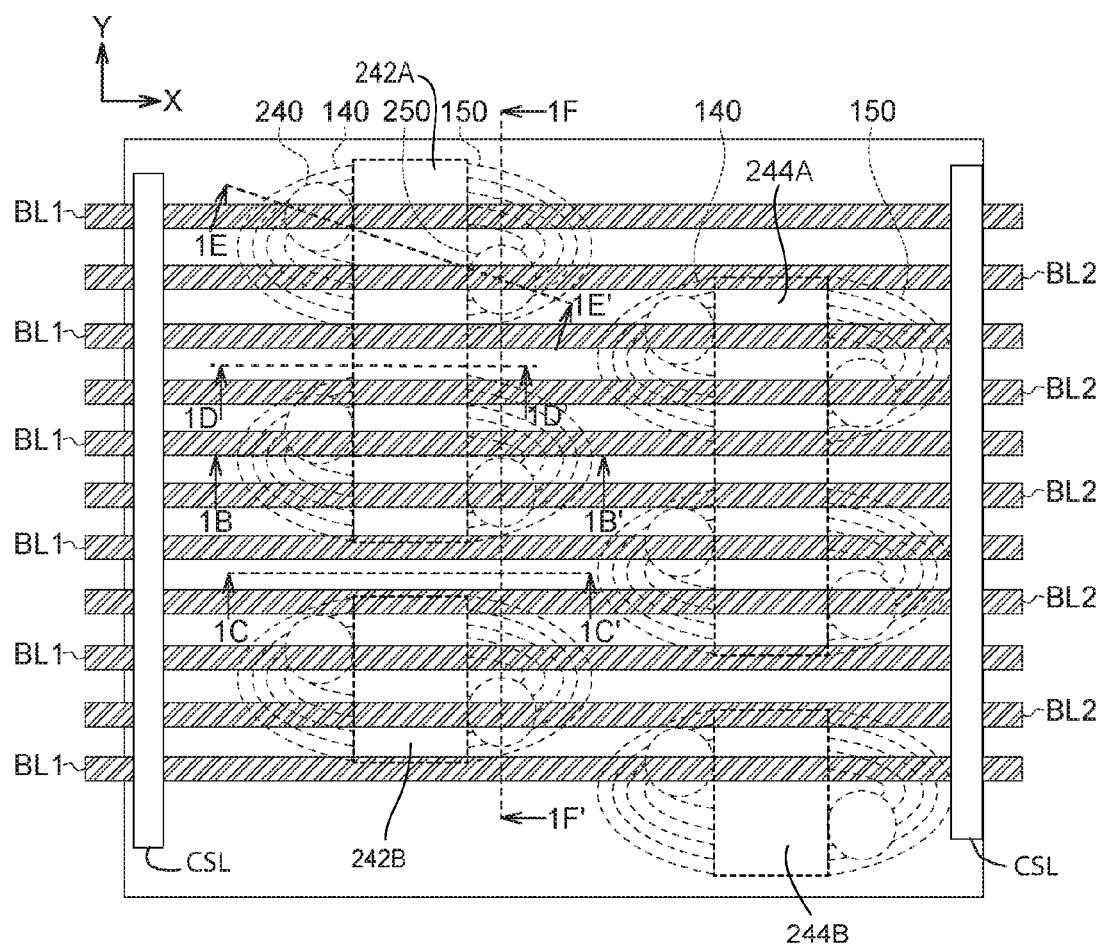
FIG. 1A shows a top view of an example of a semiconductor structure according to an embodiment of the present disclosure.

In the embodiments of the present disclosure, a semiconductor structure and a method of manufacturing the same are provided. In the exemplary semiconductor structure, a pair of memory structures both have concave cross-sections and are separated from each other by an isolation trench; accordingly, the memory density in a unit area is increased, and hence a greater memory storage capacity is achieved. In the example, the memory structures are vertical. From this pair, the first memory structure and the second memory structure are bilaterally symmetric with respect to the isolation trench. The first memory structure and the second memory structure have cross-sections shapes that are complementary. A group of neighboring first memory structures may form a first memory structure cluster. The neighboring first memory structures share an identical isolation trench. Likewise, a group of neighboring second memory structures may form a second memory structure cluster. The neighboring second memory structures likewise share an identical isolation trench. The first memory structure cluster and the second memory structure cluster may be formed along collateral sides of an isolation trench that runs the horizontal extent of the two memory structure clusters. The two clusters are bilaterally symmetric with respect to the isolation trench that divide the two clusters only. The semiconductor structure may include multiple cluster pairs divided along various isolation trenches that are separated. The various isolation trenches may be formed discontinuously and with gaps between neighboring trenches. The various trenches may be formed parallel to each other. Common source trenches may be formed on the semiconductor memory structure such that a conducting medal may fill in. The common source trenches may be formed along directions that are parallel to the various isolation trenches. The common source trenches may be formed prior to the formation of bit lines on the semiconductor structure. A gate replacement process may be implemented. The bit lines are generally orthogonal to the source lines and the isolation trenches. The bit lines may be organized in two groups, namely, a first group connecting to the first semiconductor memory structures and a second group connecting to the second semiconductor memory structures. The discontinuous fashion in which the isolation trenches are fabricated may give rise to a faster switch of the memory structures during write/erase operations than a continuous fashion. The conducting metal filled into the conductive layers during a gate replacement process as well as the interlaced conductive and insulating layers grown on the substrate of the semiconductor structure and between the gaps of the isolation trenches all contribute to this improvement in switching. The following embodiments are for the purpose of elaboration only, not for limiting the scope of protection of the disclosure. Besides, some of the secondary elements may be omitted in the drawings accompanying the following embodiments to highlight the technical features of the inventive concept.

In the embodiments disclosed herein, the semiconductor structure 100 represents the main structure of a three-dimensional (3D) memory device.

As shown in FIGS. 1A-1F, the semiconductor structure 100 includes a substrate 110, more than one conductive layer 120, more than one insulating layer 130, more than one first memory structure 140, more than one second memory structure 150, more than one isolation trench 160, more than one common source trench (CSL), and more than one bit line (BL1 and BL2). The conductive layers 120 and the insulting layers 130 are formed on the substrate 110. The conductive layers 120 and the insulating layers 130 are interlaced and stacked on the substrate 110. The first memory structure 140 and a second memory structure 150 penetrate the conductive layers 120 and the insulating layers 130 and are formed on the substrate 110. As illustrated in FIG. 1A, an example of the first memory structure 140 has a first cross-section shape, and an example of the second memory structure 150 has a second cross-section shape. The first cross-section shape and the second cross-section shape may complement each other.

A structure on semiconductor structure may include the first group of memory structure clusters (e.g., memory structures 140 on the left hand side of isolation trenches 242A and 242B) and the second group of memory structure clusters (e.g., memory structures 150 on the right hand side of isolation trenches 242A and 242B).

Each memory structure cluster may be a vertical memory structure cluster and each memory structure may be a vertical memory structure. First memory structure clusters may each include one to four first memory structure 140. A first group of memory structure clusters may include more than one first memory structure clusters 140, each formed on substrate 110 and through the conductive layers 120 and insulating layers 130. Second memory structure cluster may each include one to four first memory structure 150. A second group of memory structure clusters may include more than one second memory structure clusters 150, each formed on substrate 110 and through the conductive layers 120 and insulating layers 130.

FIG. 1A particularly shows isolation trenches 242A and 242B as well as 244A and 244B. Each isolation trench disposed between a particular first memory structure cluster (e.g., memory structures 140 on the left hand side of isolation trenches 242A and 242B) and a particular second memory structure cluster (e.g., memory structures 150 on the right hand side of isolation trenches 242A and 242B) such that neighboring isolation trenches (e.g., isolation trenches 242A and 242B, 244A and 244B) are separated by a gap that is aligned with an axial direction of the neighboring trenches.

As shown in FIGS. 1B and 1D-1F, an example of isolation trench 160 is formed on the substrate 110 and located between an example of the first memory structure 140 and an example of the second memory structure 150 such that the first memory structure 140 and the second memory structure 150 are bilaterally symmetrical with respect to isolation trench 160 that divides the two.

In the embodiments, while the semiconductor structure 100 is used in a 3D memory device, the substrate 110 may function as a bottom source, the conductive layers 120 are such as word lines, the bottommost layer of the conductive layers 120 is such as a ground select line (GSL), the topmost layer of the conductive layers 120 is such as a string select line (SSL), the first memory structure 140 and the second memory structure 150 are such as memory strings, and the 3D memory device is such as a vertical channel type memory device.

In the embodiments, in the semiconductor structure 100, a pair of the vertical memory structures both have horizontal C shaped cross-sections and are separated from each other by the isolation trench 160; accordingly, the memory density in a unit area is increased, and hence a greater memory storage capacity is achieved. In the embodiment, the bilaterally symmetrically arranged first memory structure 140 and second memory structure 150 respectively connect to different bit lines, namely, BL1 and BL2, respectively; as such, the memory density is increased, and different program/erase operations can be processed simultaneously since different vertical memory structures (memory strings) can be selected via different bit lines simultaneously, and thus the processing speed can be further increased.

Figure 1B:
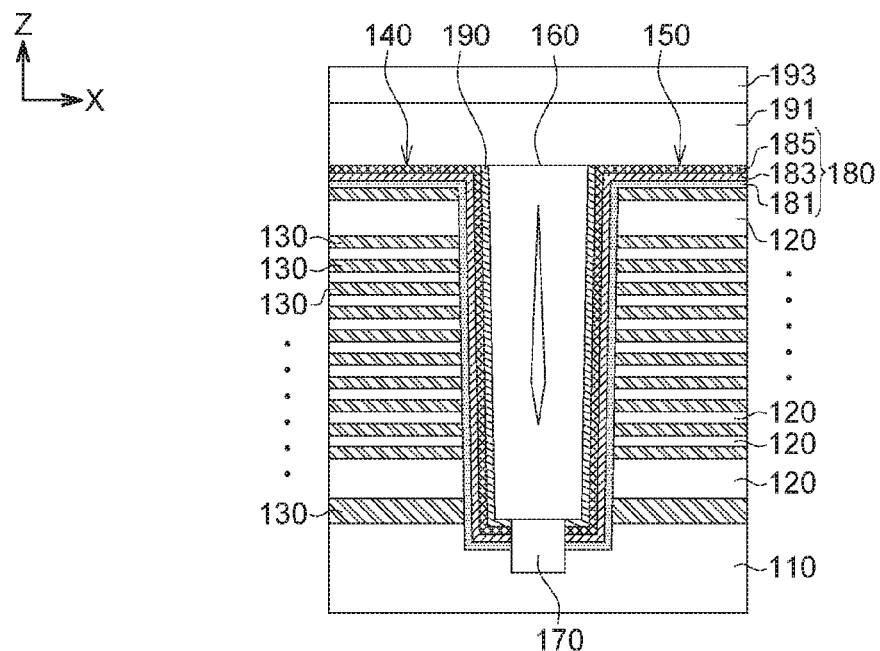
FIG. 1B is a cross-sectional view of the example of the semiconductor structure along the cross-sectional line 1B-1B' in FIG. 1A.
Figure 1C:
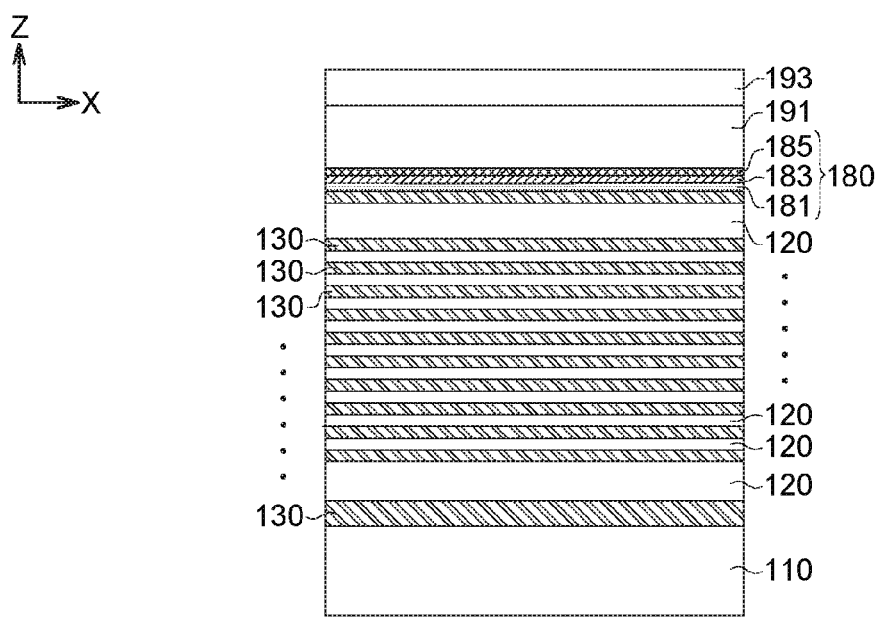
FIG. 1C is a cross-sectional view of the example of the semiconductor structure along the cross-sectional line 1C-1C' in FIG. 1A.
Figure 1D:
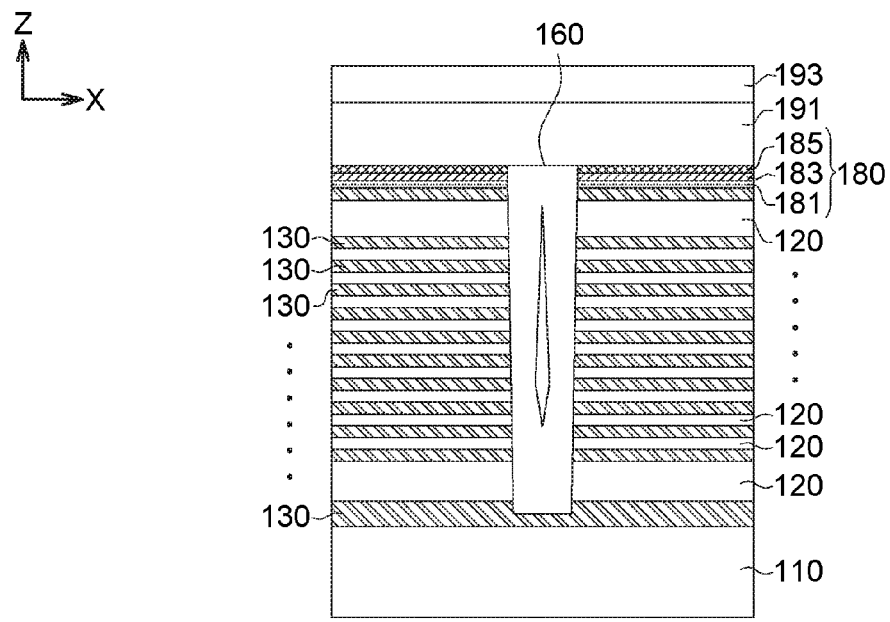
FIG. 1D is a cross-sectional view of the example of the semiconductor structure along the cross-sectional line 1D-1D' in FIG. 1A.
Figure 1E:
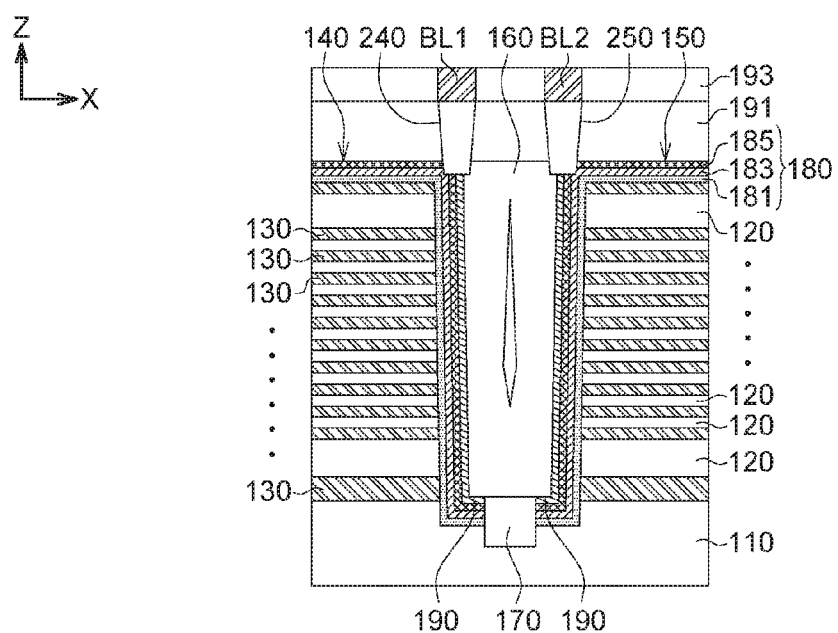
FIG. 1E is a cross-sectional view of the example of the semiconductor structure along the cross-sectional line 1E-1E' in FIG. 1A.
Figure 1F:
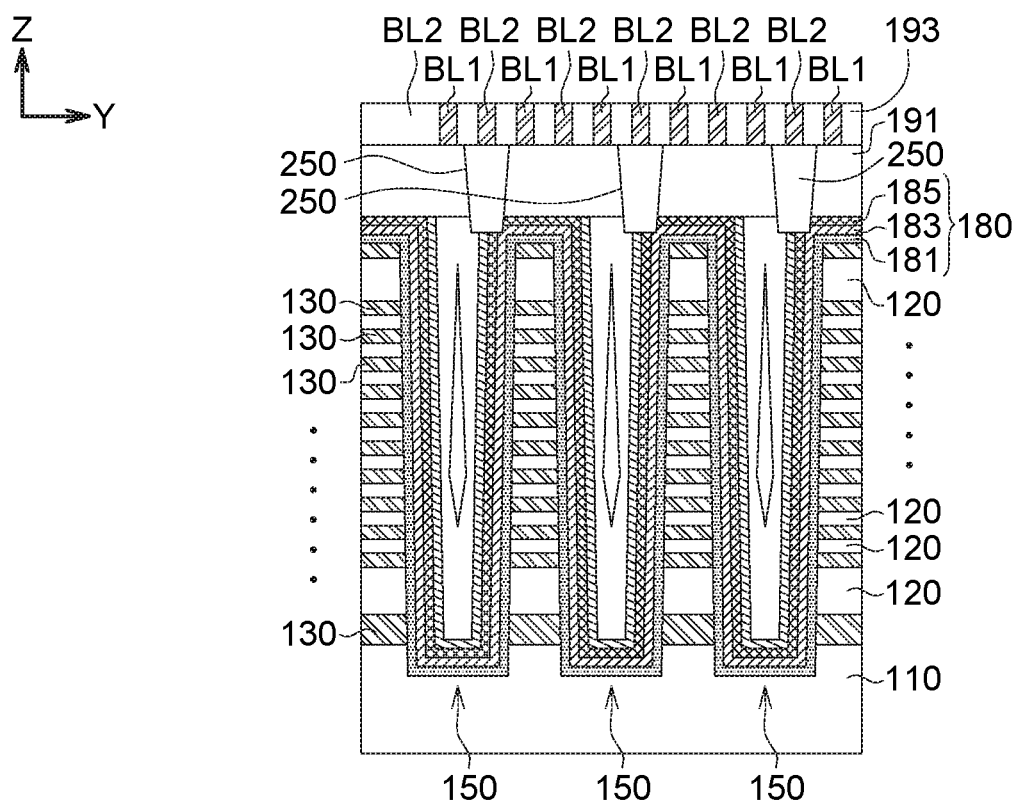
FIG. 1F is a cross-sectional view of the example of the semiconductor structure along the cross-sectional line 1F-1F' in FIG. 1A.

As shown in FIGS. 1B and 1E, the semiconductor structure 100 may further include an epitaxial structure 170 formed at the bottom of well structure and an exemplary first or second vertical memory structure. In this bottom well, the epitaxial structure 170 is formed between the isolation trench 160 and the substrate 110. The first memory structure 140 and the second memory structure 150 are both vertical and are electrically connected to the substrate 110 via a corresponding epitaxial structure 170 formed therein.

As shown in FIGS. 1B and 1D-1F, an example of the first memory structure 140 and an example of the second memory structure 150 each include a memory structure layer 180 and a channel layer 190 formed on the memory structure layer 180.

In the illustrated embodiments, the memory structure layer 180 includes a blocking layer 181, a memory storage layer 183, and a tunneling layer 185. The blocking layer 181 is formed on the conductive layers 120, the memory storage layer 183 is formed on the blocking layer 181, and the tunneling layer 185 is formed on the memory storage layer 183. The blocking layer 181 and the tunneling layer 185 may include silicon oxide layers. The memory storage layer 183 may include a silicon nitride layer, and the channel layer 190 may include a polysilicon layer.

As shown in FIG. 1A, a pattern of the first horizontal C shaped cross-section of the exemplary first memory structure 140 and a pattern of the second horizontal C shaped cross-section of the exemplary second memory structure 150 are bilaterally symmetric with respect to the isolation trench 160. For example, the notch of the C shaped pattern of the first horizontal C shaped cross-section of the exemplary first memory structure 140 and the notch of the C shaped pattern of the second horizontal C shaped cross-section of the exemplary second memory structure 150 both face toward the isolation trench 160.

Referring to FIGS. 1A, 1B and 1E, the first memory structure cluster (e.g., memory structures 140 on the left hand side of isolation trenches 242A and 242B of FIG. 1A) and the second memory structure cluster (e.g., memory structures 150 on the right hand side of isolation trenches 244A and 244B) may be formed along the sides of an isolation trench that runs the horizontal extent of the two memory structure clusters only. The two clusters are bilaterally symmetric with respect to the isolation trench that divide the two clusters. Isolation trench 160 in FIGS. 1B and 1E is another instance of isolation trenches 242A, 242B, 244A, and 244B in FIG. 1A. The semiconductor structure may include multiple cluster pairs divided along various separated isolation trenches. The various isolation trenches may be formed discontinuously and with gaps between neighboring trenches. The various trenches may be formed parallel to each other. Common source trenches (CSLs) may be formed on the semiconductor memory structure 100 that run parallel with the isolation trenches. In particular, conductor layers may comprise replacement gates with a conducting metal fill-in. An example conducting metal is tungsten.

As shown in FIGS. 1A and 1D-1F, the first memory structure 140 and the second memory structure 150 of the semiconductor structure 100 may respectively include a first contact structure 240 and a second contact structure 250. The first contact structure 240 is electrically connected to the first memory structure 140, and the second contact structure 250 is electrically connected to the second contact memory structure 150. In the embodiment, the semiconductor structure 100 may further include an isolation layer 191. The isolation layer 191 is formed on the first memory structure 140 and the second memory structure 150, and the first contact structure 240 and the second contact structure 250 are formed in the isolation layer 191. The isolation layer 191 is an interlayer dielectric layer (ILD) formed of an oxide.

As shown in FIGS. 1A and 1D-1F, the semiconductor structure 100 may further include a first bit line BL1 and a second bit line BL2. The bit lines may be formed after the formation and fill-in of the common source trenches (CSLs). The bit lines generally are orthogonal to the source lines and the isolation trenches. The first bit line BL1 is electrically connected to the first contact structure 240, and the second bit line BL2 is electrically connected to the second contact structure 250. In the embodiment, the semiconductor structure 100 may further include an isolation layer 193. The isolation layer 193 is formed on the isolation layer 191, and the first bit line BL1 and the second bit line BL2 are formed in the isolation layer 193. The isolation layer 193 is an oxide layer.

The discontinuous fashion in which the isolation trenches are fabricated on semiconductor structure 100 gives rise to a faster switch of the memory structures during write/erase operations than otherwise would be the case. The conducting metal (such as, for example, tungsten) filled into the common source trenches and the interlaced conductive and insulating layers grown on the substrate of the semiconductor structure and between the gaps of the isolation trenches all contribute to this improvement in switching.

Figure 2:
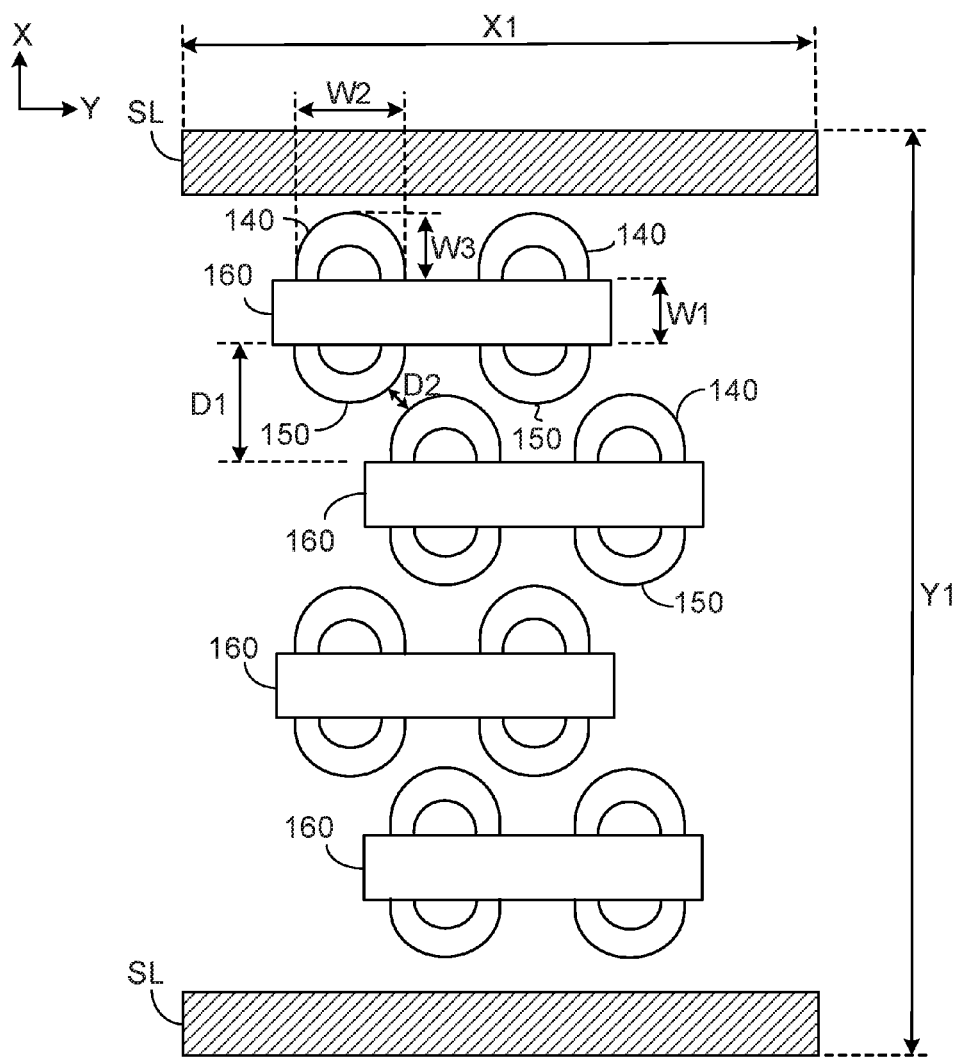
FIG. 2 shows a top view of the arrangement of the first vertical memory structures and the second vertical memory structures according to an embodiment of the present disclosure.

FIG. 2 shows a top view of the arrangement of the exemplary first memory structures 140 and the exemplary second memory structures 150 of the semiconductor structure 100 according to an embodiment of the present disclosure. In the drawings, some of the secondary elements may be omitted and some of the elements are shown in a perspective manner to highlight the technical features of the inventive concept.

As shown in FIG. 2, an example of the first memory structures 140 and an example of the second memory structures 150 may form a pair of memory structures and are separated by an example of the isolation trench 160. In the embodiment, the width W1 of the isolation trench 160 is about 40-50 nm, and the first memory structure 140 and the second memory structure 150 are separated from each other by the width W1 of the isolation trench 160. In the embodiment, the distance D1, as illustrated, between two laterally separated isolation trenches 160 is about 90 nm.

In the embodiment, the size of the first horizontal C shaped cross-section of the first memory structure 140 and the size of the second horizontal C shaped cross-section of the second memory structure 150 are about 50-80 nm. The size generally refers to a dimension of the horizontal C shaped cross-sections, such as a radius/diameter of the inner curvature or a diameter. In the embodiment, the size of the first horizontal C shaped cross-section and the size of the second horizontal C shaped cross-section are substantially the same. For example, as shown in FIG. 2, the sizes and shapes of the first horizontal C shaped cross-sections and the second horizontal C shaped cross-sections are substantially the same. An example width W2 of each of the C shaped cross-sections may be as high as about 80 nm, and an example height W3 of each of the C shaped cross-sections may be as low as about 50 nm. Moreover, a first memory structure 140 and a second memory structure 150 may form a pair in which the distance D2 between the first memory structure 140 and the second memory structure 150 may be within a range of about 30-40 nm.

In the embodiment, a memory array unit has a length Y1, which is along the Y direction and defined by, for example, adjacent local source lines SL, of about 560 nm and a width X1, which is along the X direction, of about 156 nm is taken as an example. According to the embodiments of the present disclosure, the memory array unit of such size can include 16 memory structures (memory strings); that is a capacity of 92 memory strings in each area of 1 square micrometer. On the other hand, while cross-sections of memory string structures are concentric circles with a size of about 110 nm, such memory array unit having a length of about 480 nm along the Y direction and a width of about 160 nm along the X direction can only include 8 memory strings; as such, a capacity of only 52 memory strings in each area of 1 square micrometer may be obtained. According to the above comparison, the memory density can be increased by about 1.8 times while the memory array unit is designed according to the embodiments of the present disclosure.

Moreover, compared to the memory string structure having cross-sections which are concentric circles with a size of about 110 nm, according to the embodiments of the present disclosure, the memory structures have C shaped cross-sections with a size of about 50-80 nm, which have a relatively small curvatures; as such, field enhancement effects are better, and hence the performance of the whole device can be further improved.

Furthermore, as shown in FIG. 1A, the first contact structure 240 and the second contact structure 250 are not aligned with each other along the bit lines BL1/BL2 direction; on the contrary, the first contact structure 240 and the second contact structure 250 are staggered along the bit lines BL1/BL2 direction. In addition, the first memory structures 140 and the second memory structures 150 are arranged in a honeycomb-like arrangement, such that more bit lines can be connected from a unit area, and therefore the memory density can be effectively increased.

As discussed in further detail below, the insulation trenches are fabricated in a discontinuous manner and heavy metal fill-in at these trenches lead to a more conducive environment in which the switch speed associated with each memory access operation (such as write/erase) is improved. Referring to FIGS. 1A-1E and 3A-13B, a process for manufacturing a semiconductor structure 100 according to an embodiment of the present disclosure is illustrated.

Figure 3A:
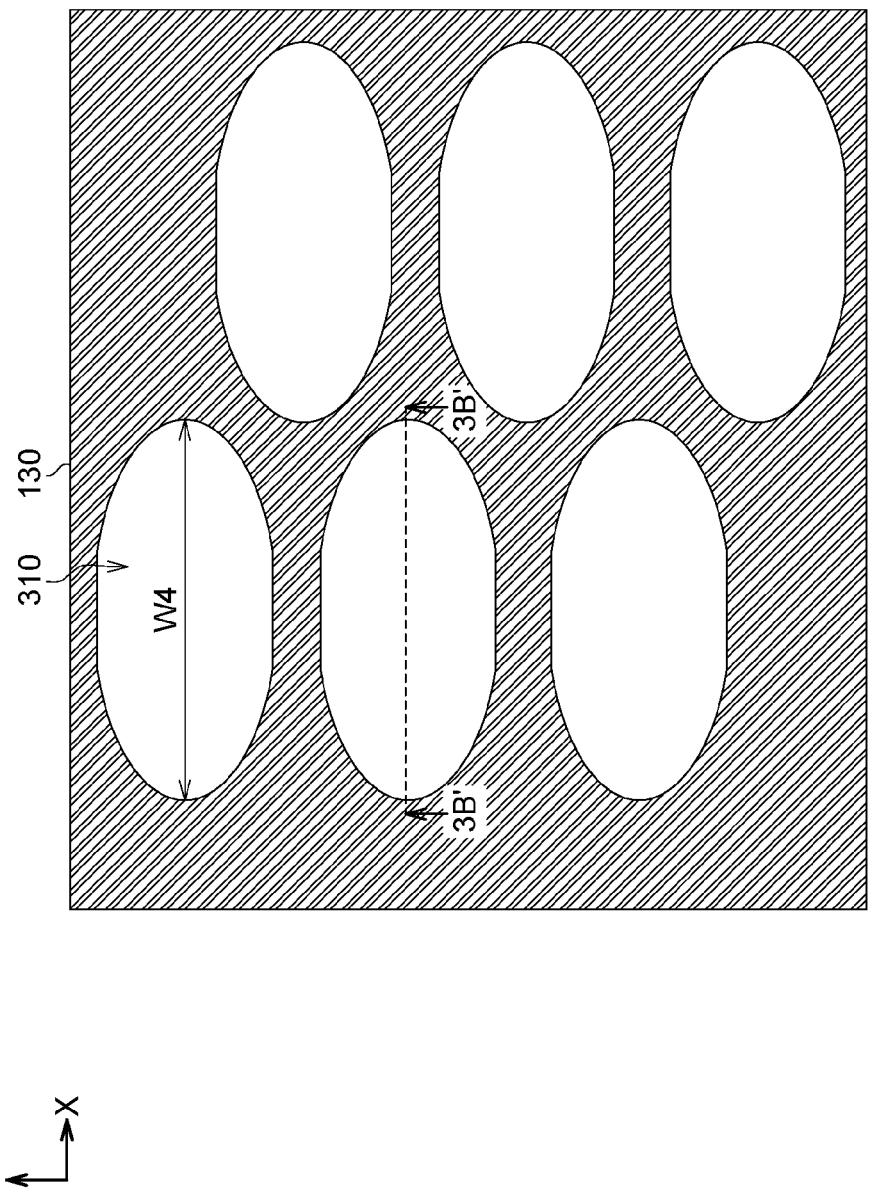
Figure 3B:
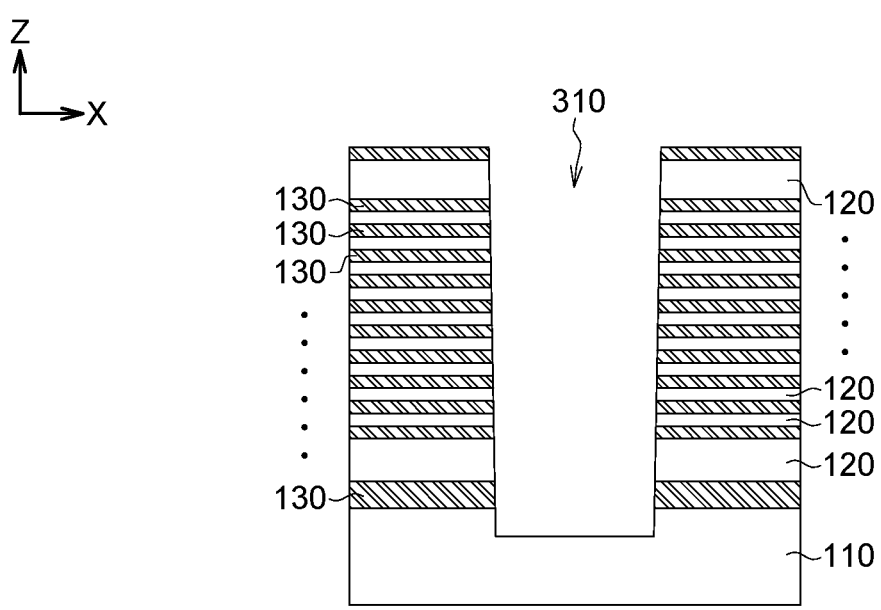

FIG. 3B is a cross-sectional view along the cross-sectional line 3B-3B' in FIG. 3A. As shown in FIGS. 3A-3B, the substrate 110 is provided, and the conductive layers 120 and the insulating layers 130 are formed on the substrate 110. The conductive layers 120 and the insulating layers 130 are interlaced and stacked on the substrate 110.

Next, the first memory structure 140 and the second memory structure 150 are formed on the substrate 110. The manufacturing method of the first memory structure 140 and the second memory structure 150 may include the following steps.

As shown in FIGS. 3A-3B, a recess 310 is formed, and the recess 310 penetrates the conductive layers 120 and the insulating layers 130 and stops on the substrate 110. As shown in FIG. 3A, the recess 310 has an elliptical cross-section, and the long axis (the longer diameter) W4 of the elliptical cross-section may be as long as about 150 nm.

Figure 4A:
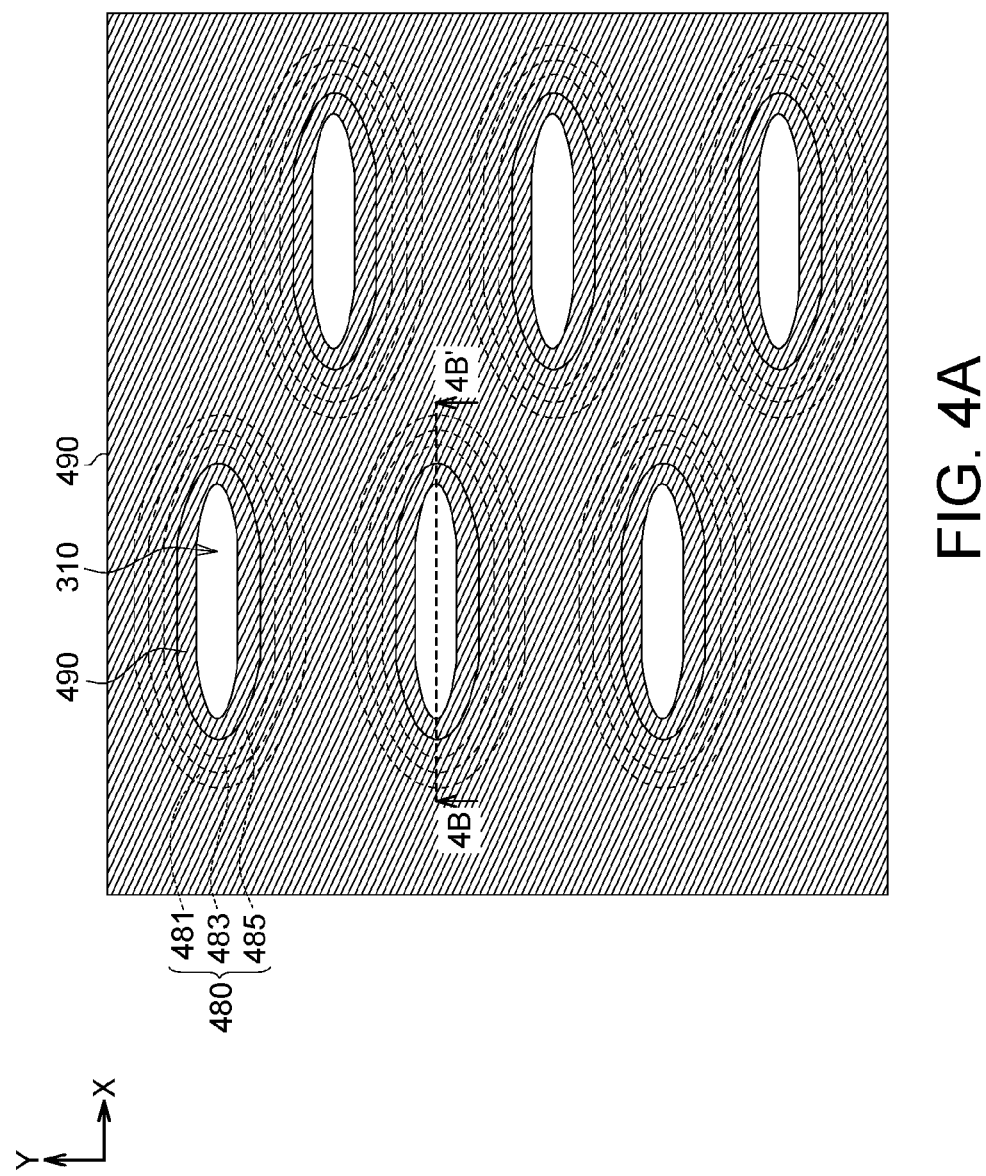
Figure 4B:
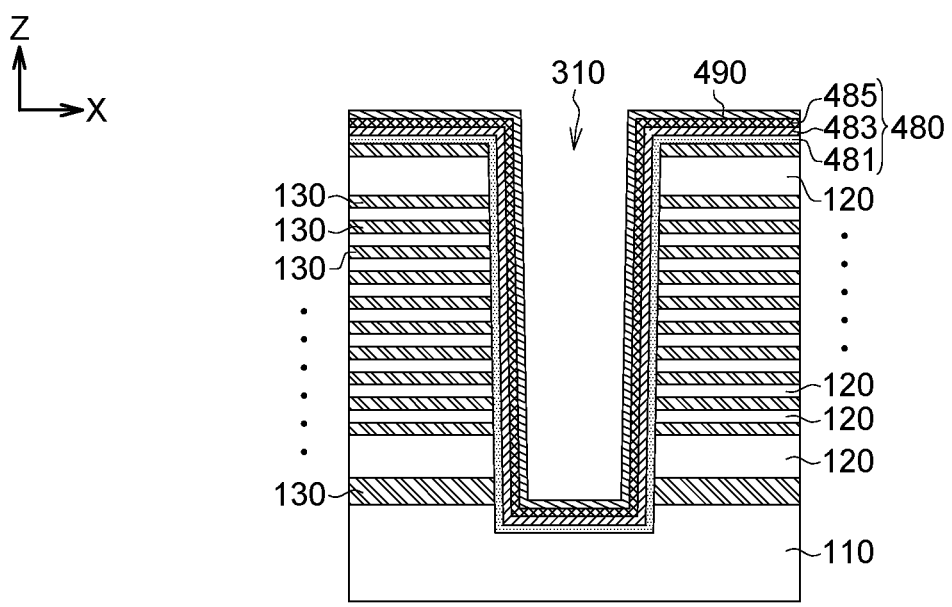

FIG. 4B is a cross-sectional view along the cross-sectional line 4B-4B' in FIG. 4A. As shown in FIGS. 4A-4B, a memory structure material layer 480 is formed in the recess 310, and a channel material layer 490 is formed on the memory structure material layer 480. The memory structure material layer 480 includes a blocking material layer 481, a memory storage material layer 483, and a tunneling material layer 485. The blocking material layer 481 is formed on the conductive layers 120, the memory storage material layer 483 is formed on the blocking material layer 481, and the tunneling material layer 485 is formed on the memory storage material layer 483. In the embodiment, the blocking material layer 481 and the tunneling material layer 485 may include silicon oxide layers, the memory storage material layer 483 may include a silicon nitride layer, and the channel material layer 490 may include a polysilicon layer.

Figure 5A:
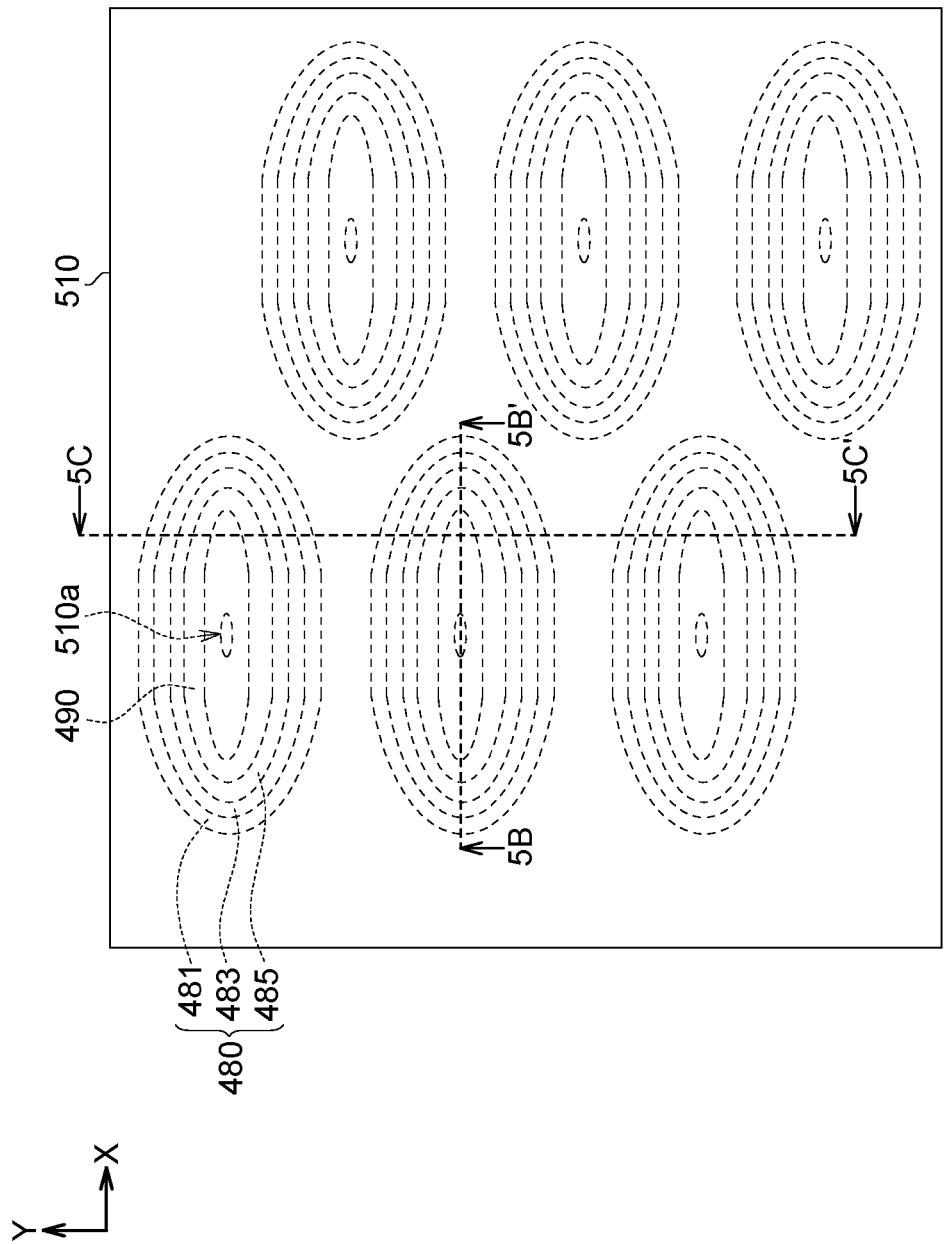
Figure 5B:
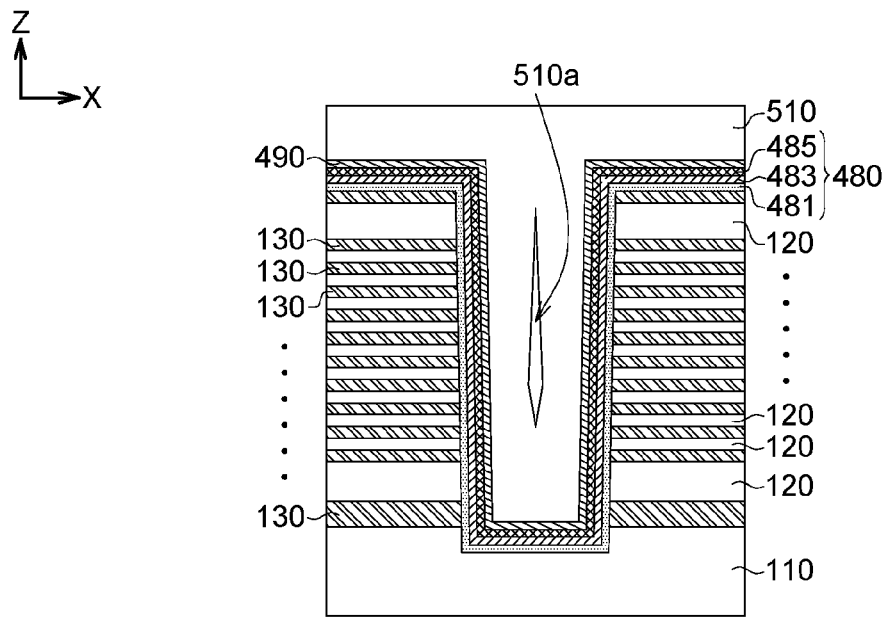
Figure 5C:
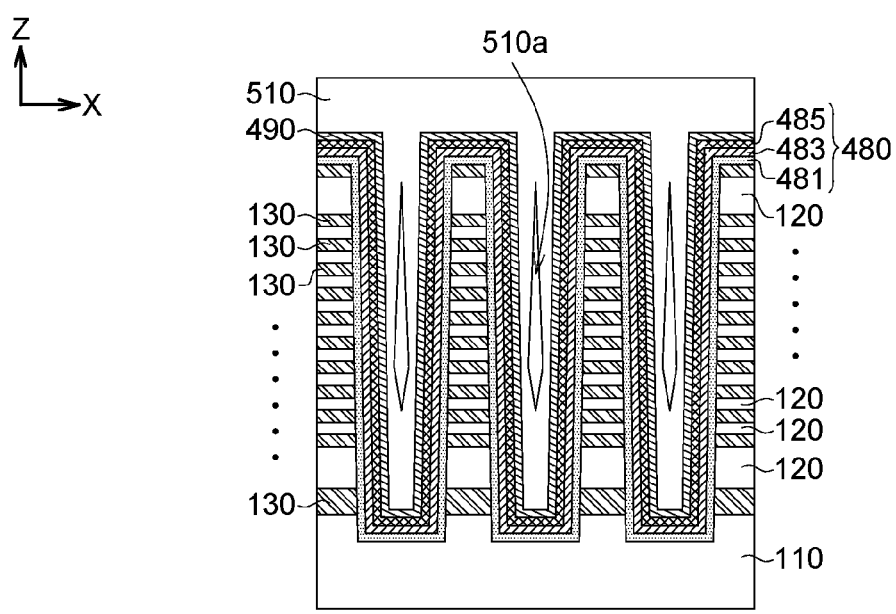

FIG. 5B is a cross-sectional view along the cross-sectional line 5B-5B' in FIG. 5A, and FIG. 5C is a cross-sectional view along the cross-sectional line 5C-5C' in FIG. 5A. As shown in FIGS. 5A-5C, an oxide material layer 510 is formed on the channel material layer 490 and filled in the recess 310, and the oxide material layer 510 has an air gap 510a therein.

Figure 6A:
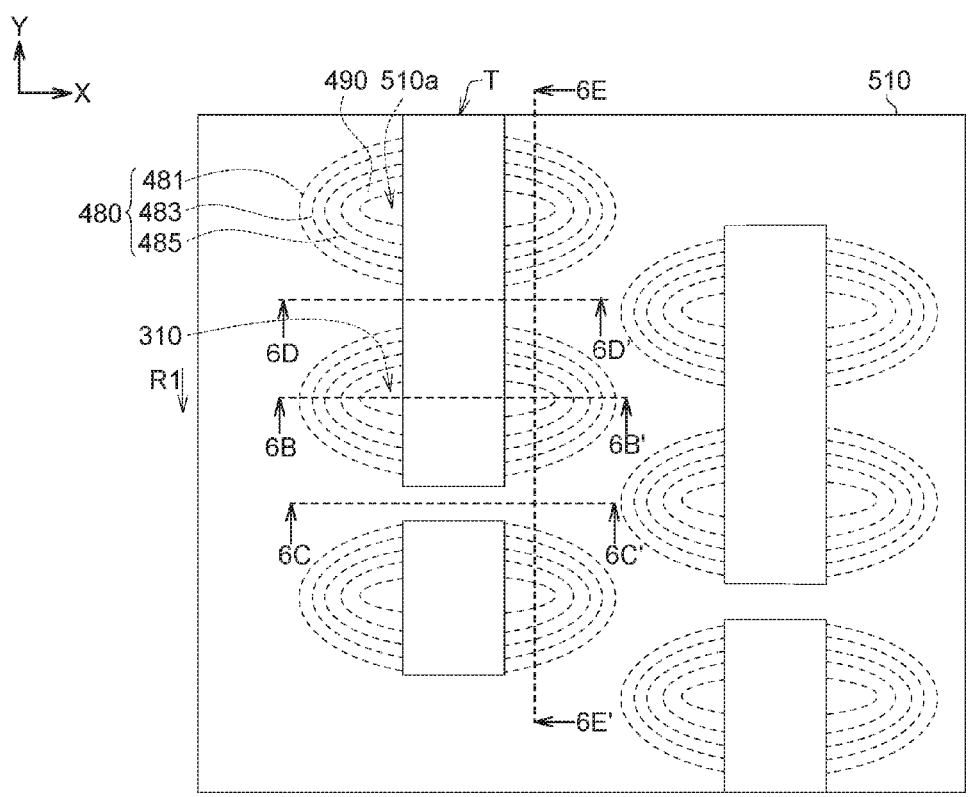
Figure 6B:
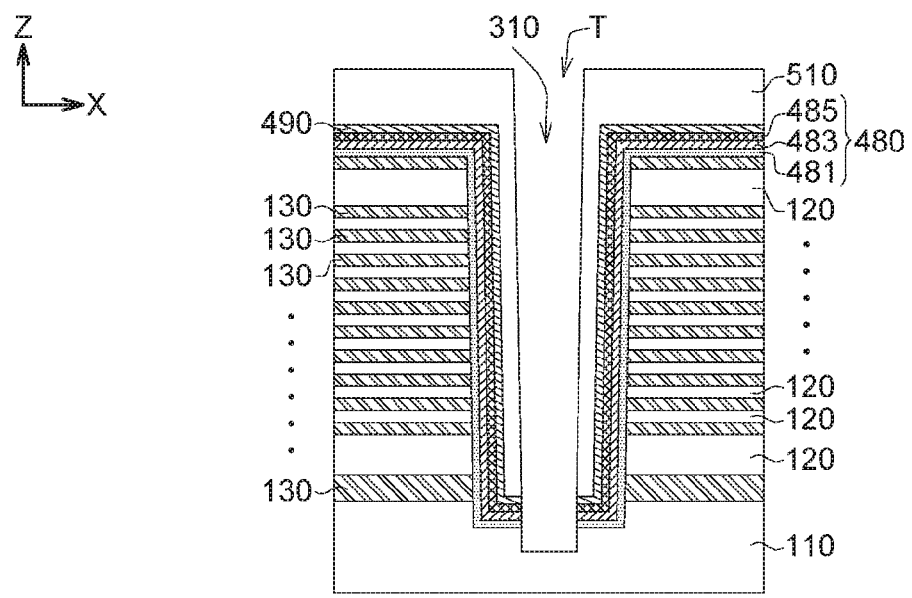
Figure 6C:
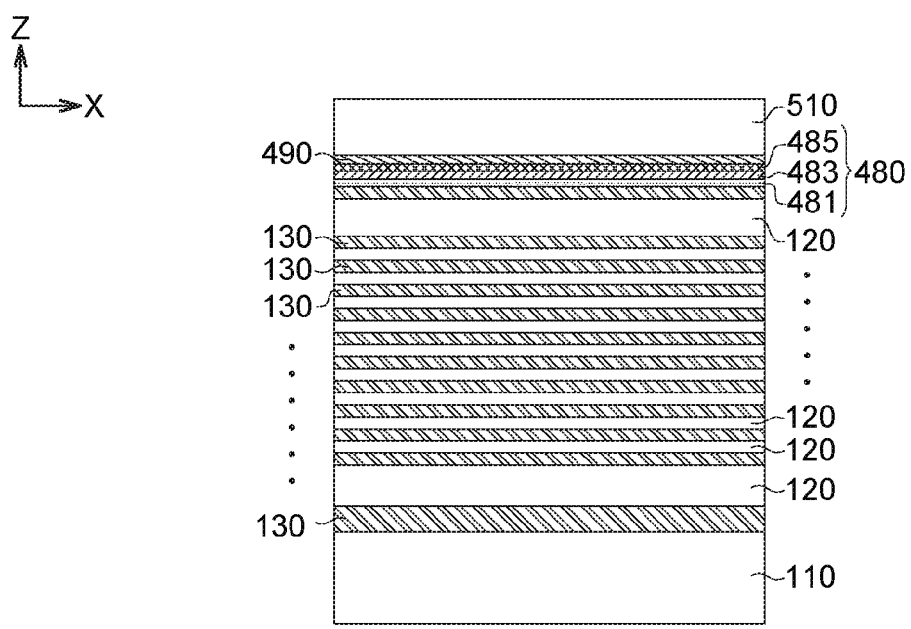
Figure 6D:
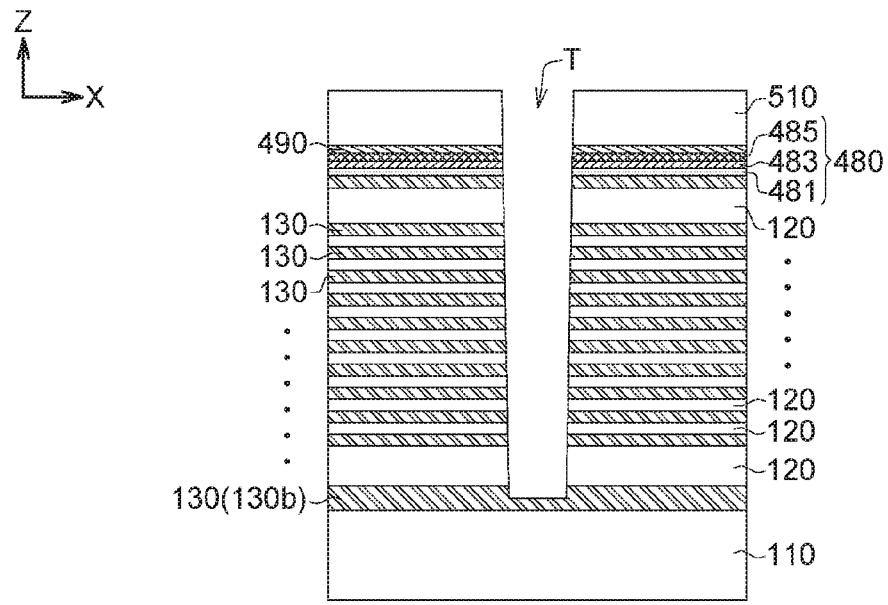
Figure 6E:
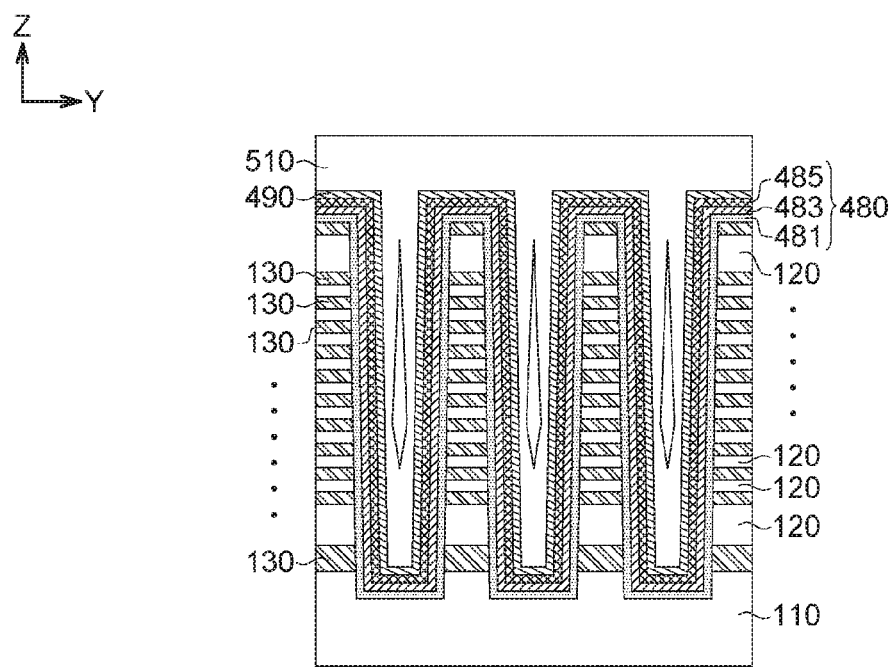

FIG. 6B is a cross-sectional view along the cross-sectional line 6B-6B' in FIG. 6A, FIG. 6C is a cross-sectional view along the cross-sectional line 6C-6C' in FIG. 6A, FIG. 6D is a cross-sectional view along the cross-sectional line 6D-6D' in FIG. 6A, and FIG. 6E is a cross-sectional view along the cross-sectional line 6E-6E' in FIG. 6A. As shown in FIGS. 6A-6E, a portion of the conductive layers 120, a portion of the insulating layers 130, a portion of the memory structure material layer 480, a portion of the channel material layer 490, and a portion of the oxide material layer 510 along the short axis direction R1 of the elliptical cross-section are removed for forming a trench T that spans the horizontal extent of two memory structures only.

As shown in FIGS. 6A-6D, the portion of the conductive layers 120, the portion of the insulating layers 130, the portion of the memory structure material layer 480, the portion of the channel material layer 490, and the portion of the oxide material layer 510 are removed by an etching process. After the etching process, as shown in FIG. 6B, the portion of the memory structure material layer 480, the portion of the channel material layer 490, and the portion of the oxide material layer 510 in the recess 310 are removed to expose the substrate 110. After the etching process, as shown in FIG. 6D, the portion of the conductive layers 120 and the portion of the insulating layers 130 outside the recess 310 are removed to expose a bottommost layer 130b of the insulating layers 130. In other words, due to the existence of the air gap 510a, the materials in the recess 310 are etched at a more rapid etching rate, resulting in a deeper etching depth, and the corresponding region of the trench T connects to the substrate 110. The materials outside the recess 310 without the air gap 510a therein are etched at a slower etching rate, resulting in a shallower etching depth, and the corresponding region of the trench T only reaches the bottommost layer 130b of the insulating layers 130 without contacting the substrate 110. Moreover, the trench T does not extend all the way to divide recesses 310 created on the semiconductor structure 100. In some implementations, trenches are fabricated on the semiconductor structure 100 with gaps between neighboring trenches. Indeed, FIG. 6C shows a cross-sectional views over a gap between neighboring trenches while FIG. 6D shows a cross-sectional view over a trench. In some implementations, the trench T may extend horizontally to divide a number of recesses, for example, two to four recesses.

The formation of the trench T allows the formation of the first memory structures 140 and the second memory structures 150 in the following steps, thereby the manufactured semiconductor structure may be provided with the effects and advantages aforementioned.

Figure 7A:
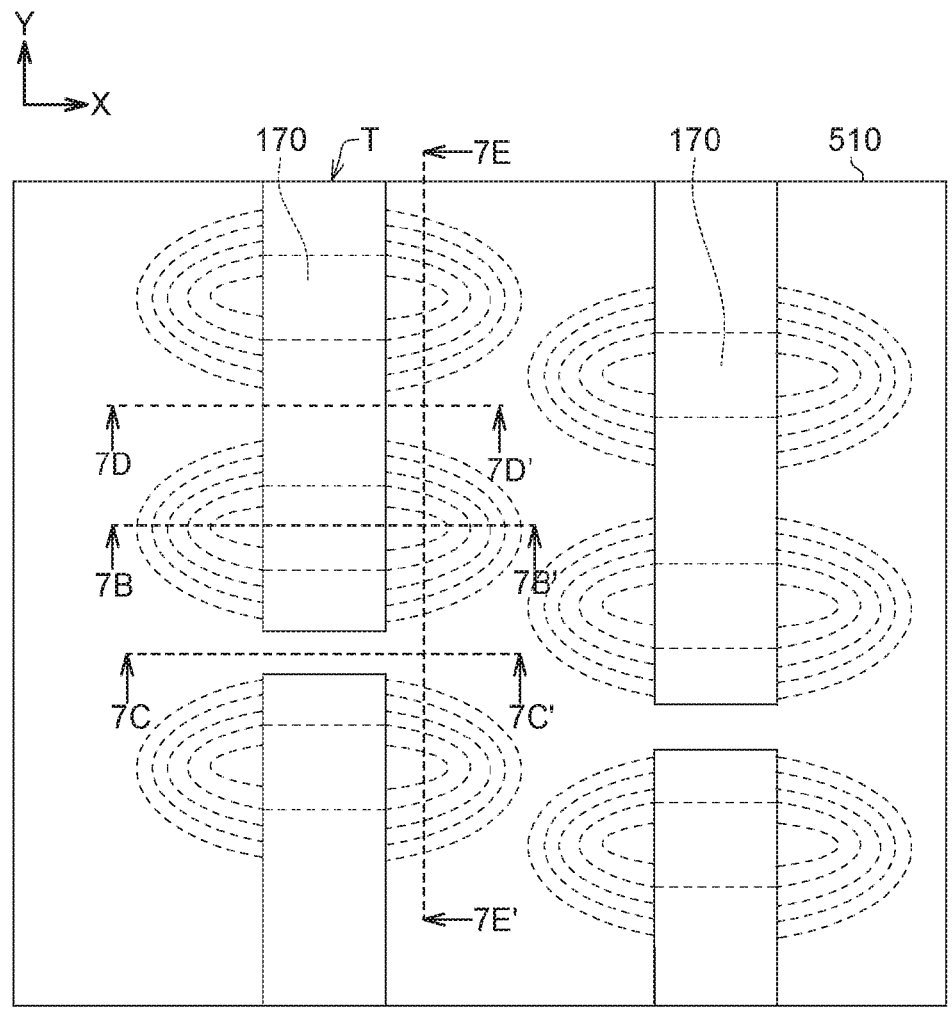
Figure 7B:
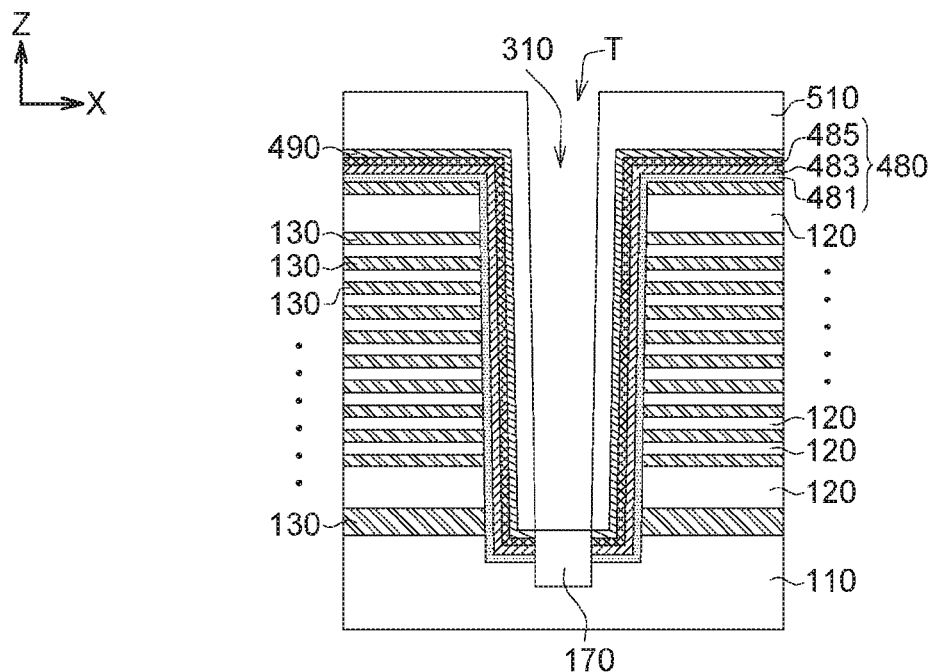

In some implementations, the trench T may extend horizontally to divide a number of recesses, for example, two to four recesses. As shown in FIG. 7B, after the trench T is formed to cover the horizontal span of a number of recesses (e.g., 2-4), the epitaxial structure 170 is formed on the substrate 110 in the trench bottom of each recess 310. That is, the epitaxial structure 170 is formed between the isolation trench 160 and substrate 110.

Figure 7C:
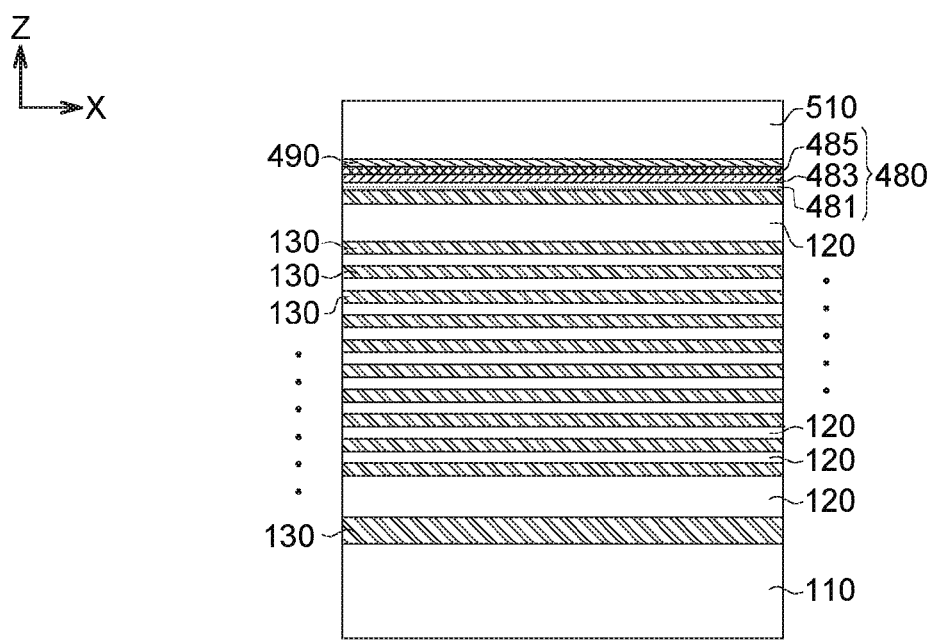
Figure 7D:
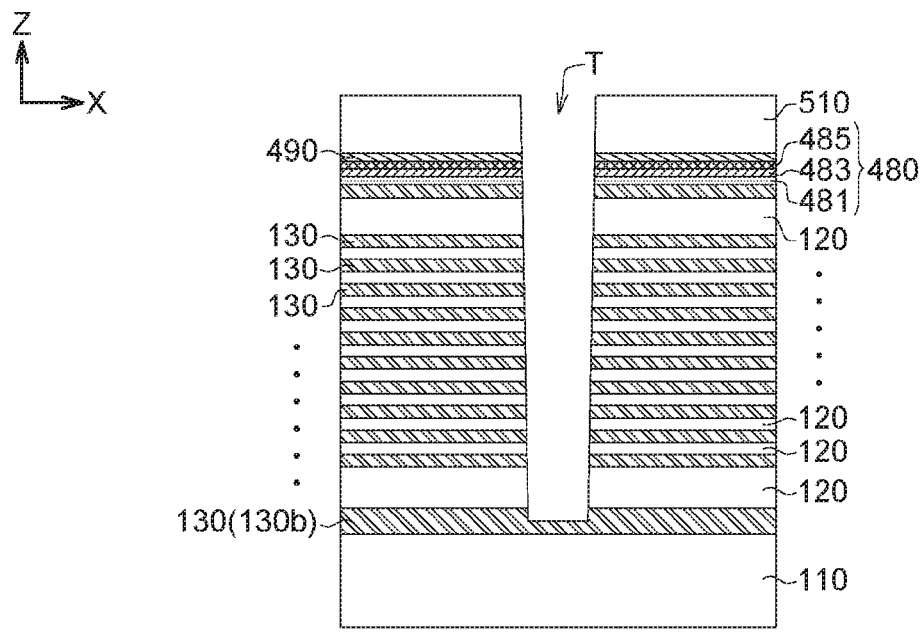
Figure 7E:
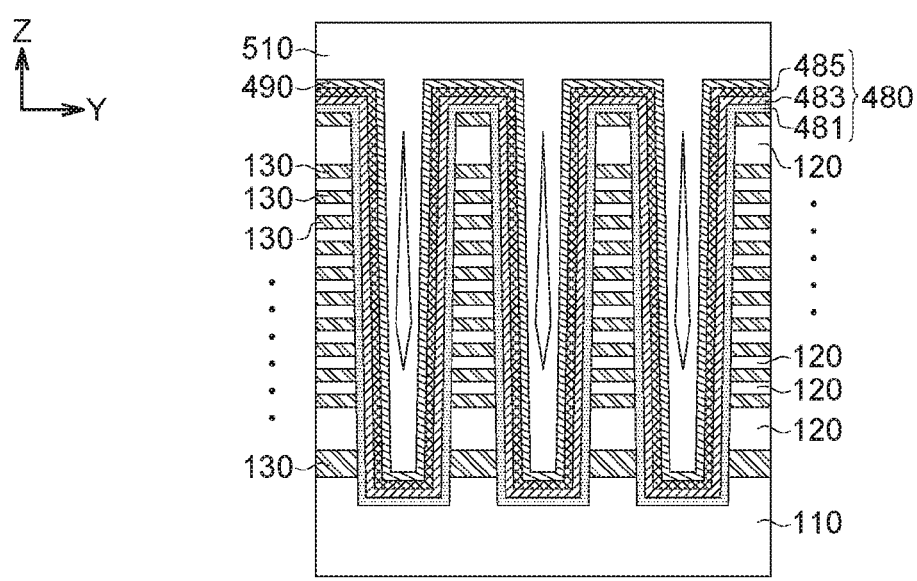

In the embodiment, the epitaxial structure 170 is formed by a selective epitaxial growth (SEG) process, such that the region where the epitaxial structure 170 is grown is highly selective, that is, the epitaxial structure 170 is grown on a surface with crystal seeds. For example, the epitaxial structure 170 may be grown on the surface of the substrate 110 having single crystal silicon structure, rather than on other materials, e.g. an oxide layer or a polysilicon layer. Such layered structures are illustrated in cross-sectional views from FIGS. 7C-7E. In particular, FIG. 7C shows a cross-sectional views over a trench while FIG. 7D shows a cross-sectional view over a gap between neighboring trenches. FIG. 7E is a cross-sectional view along the cross-sectional line 7E-7E' in FIG. 7A.

Figure 8A:
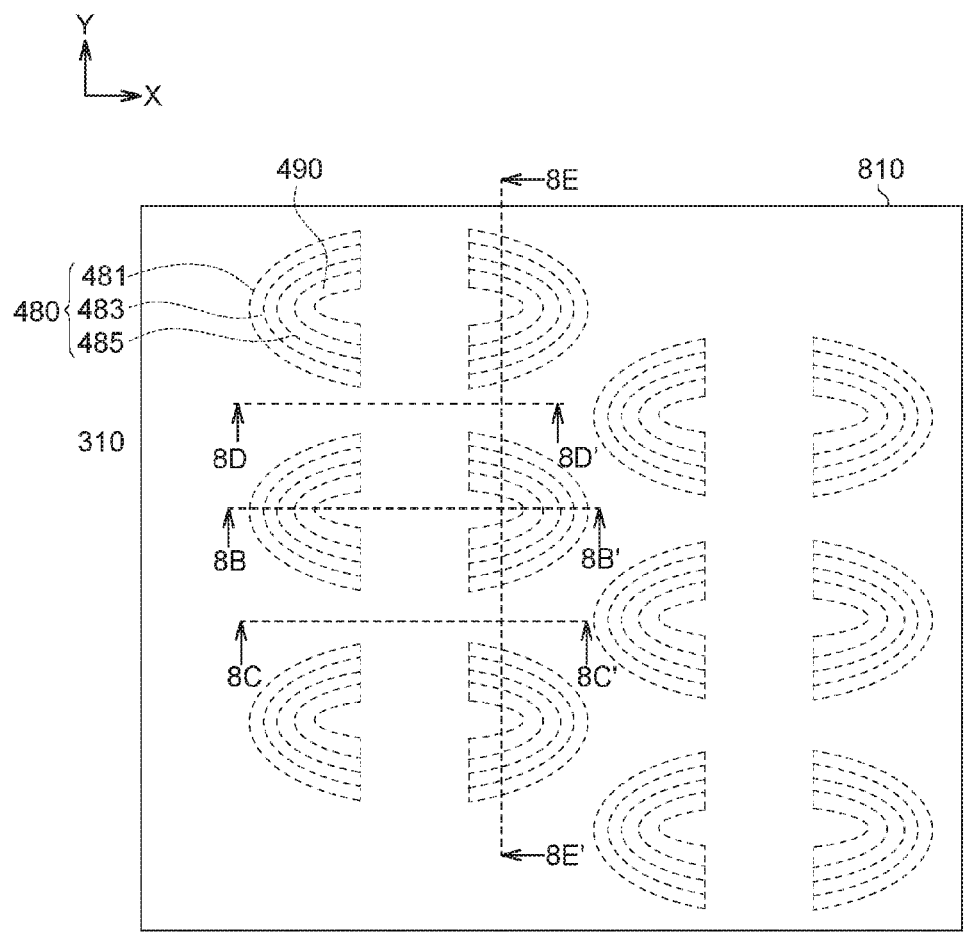
Figure 8B:
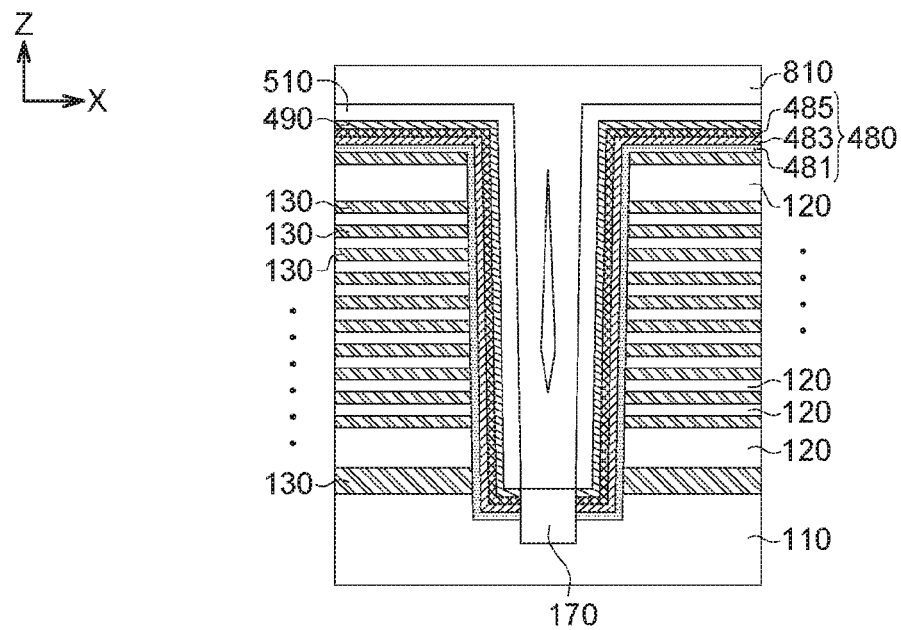
Figure 8C:
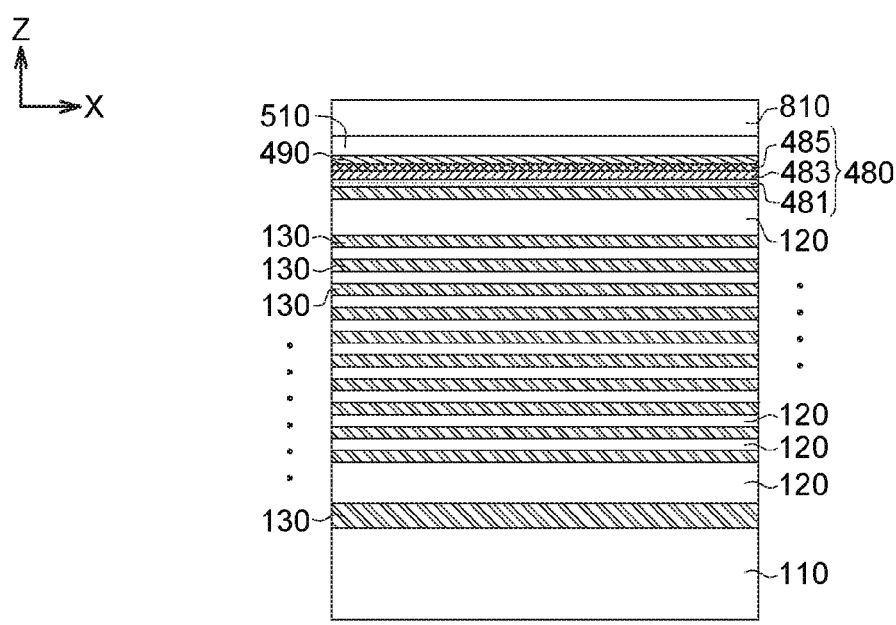
Figure 8D:
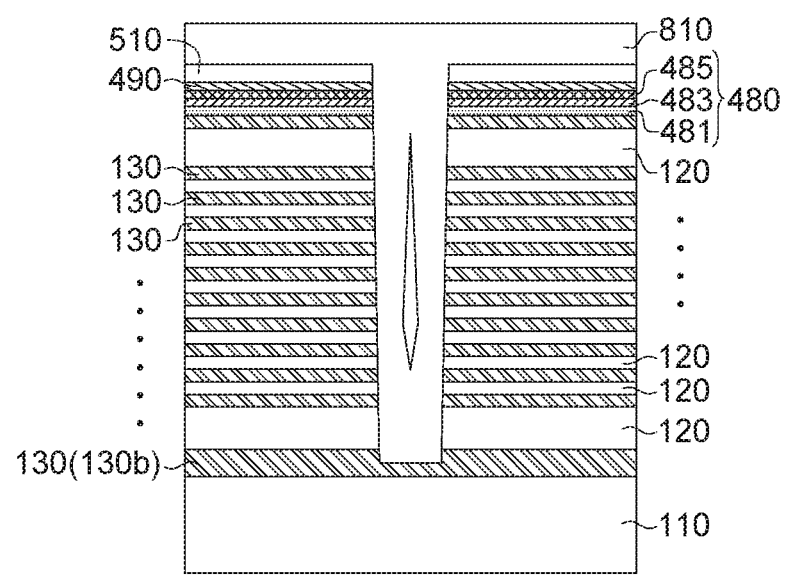
Figure 8E:
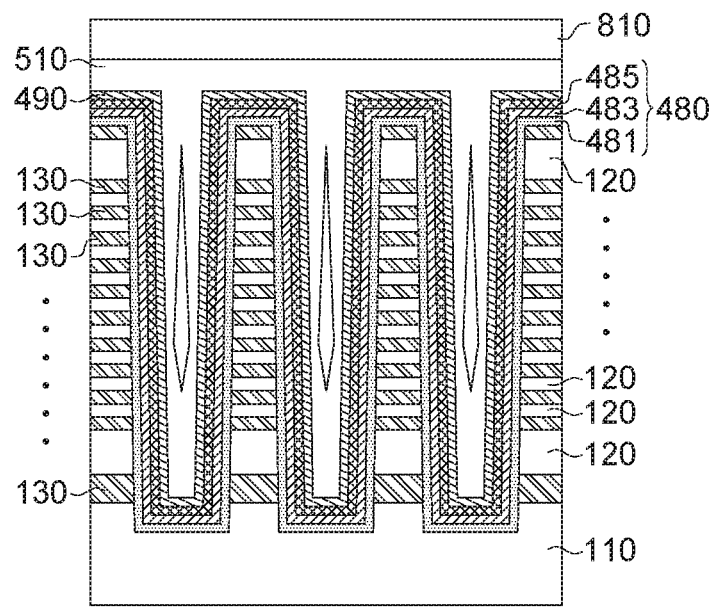

As shown in FIGS. 8B and 8D-8E, an isolating material 810 is filled in the trench T. As such, the isolation trench 160 is formed. Moreover, FIG. 8C shows a cross-sectional views over a gap between neighboring trenches while FIG. 8D shows a cross-sectional view over a trench.

Figure 9A:
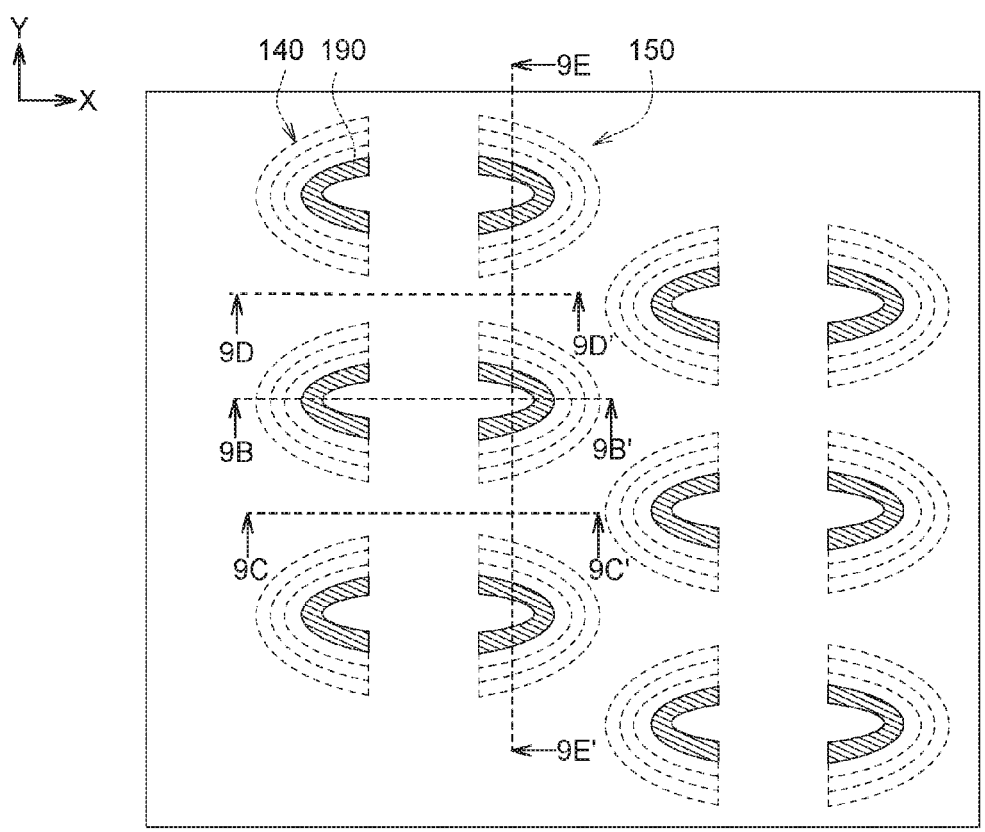
Figure 9B:
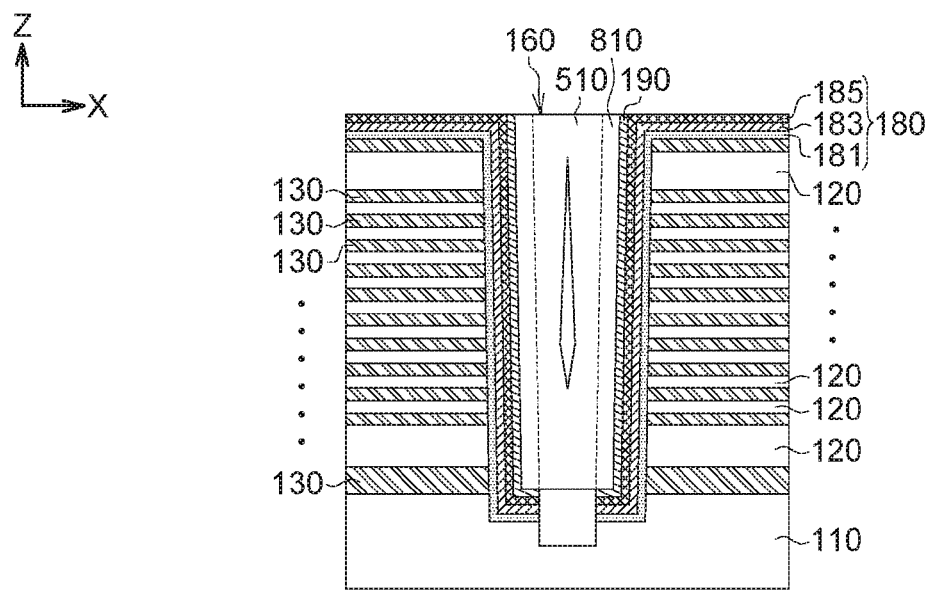
Figure 9C:
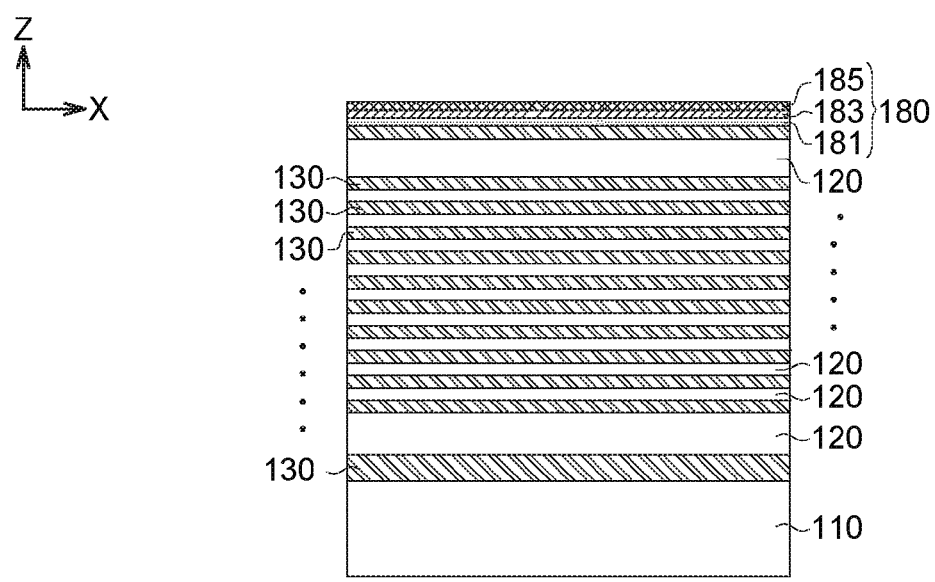
Figure 9D:
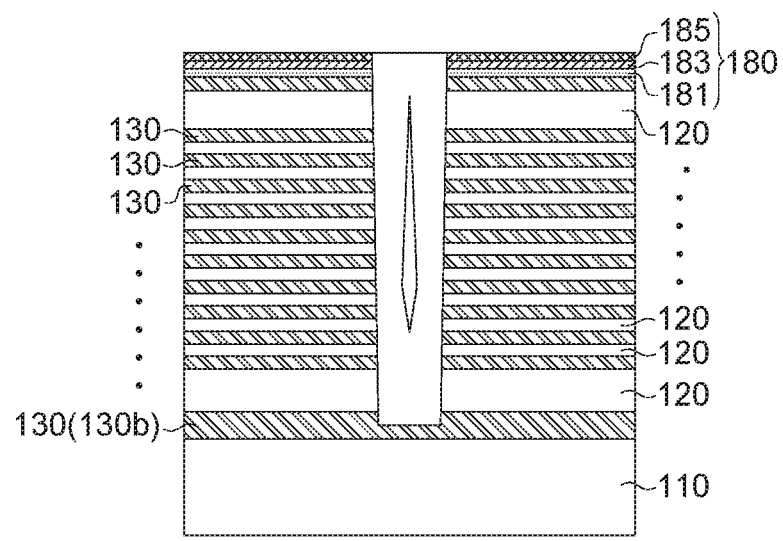
Figure 9E:
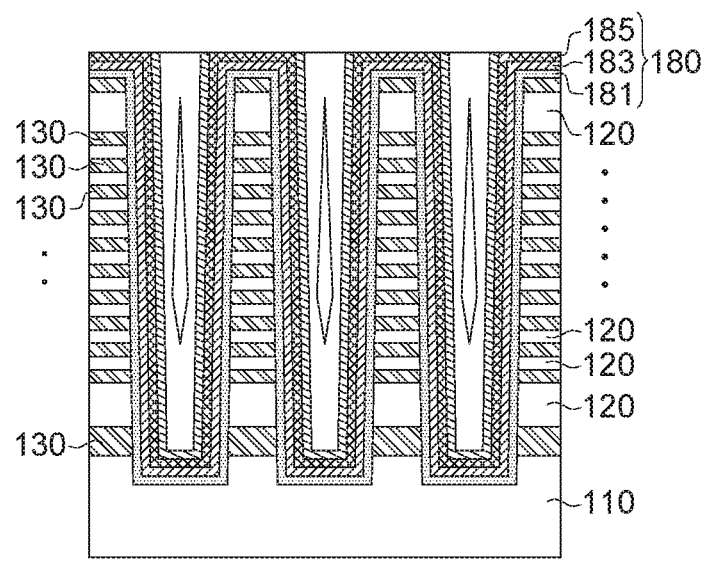

As shown in FIGS. 9A-9C and 9E, the channel material layer 490 exposed outside the trench T is removed by a chemical mechanical polishing (CMP) process for forming the channel layers 190. Moreover, FIG. 9C shows a cross-sectional views over a gap between neighboring trenches while FIG. 9D shows a cross-sectional view over a trench.

As such, as shown in FIGS. 9A-9C and 9E, the first memory structures 140 and the second memory structures 150 are formed. The first memory structures 140 and the second memory structures 150 penetrate the conductive layers 120 and the insulating layers 130, the first memory structures 140 have first horizontal C shaped cross-sections, and the second memory structures 150 have second horizontal C shaped cross-sections.

Moreover, after the CMP process, the oxide material layer 510 and the isolating material 810 remained in the trench T form the isolation trench 160. The isolation trench 160 is formed on the substrate 110 and located between the first memory structure 140 and the second memory structure 150.

In addition, each of the channel layers 190 of the memory structures are separated from one another along the Y direction, such that the epitaxial structures 170 are located between the isolation trench 160 and the substrate 110, and the first memory structures 140 and the second memory structures 150 are electrically connected to the substrate 110 via the epitaxial structures 170. Specifically speaking, the channel layers 190 of the first memory structures 140 and the channel layers 190 of the second memory structures 150 are electrically connected to the substrate 110 via the epitaxial structures 170.

Figure 10A:
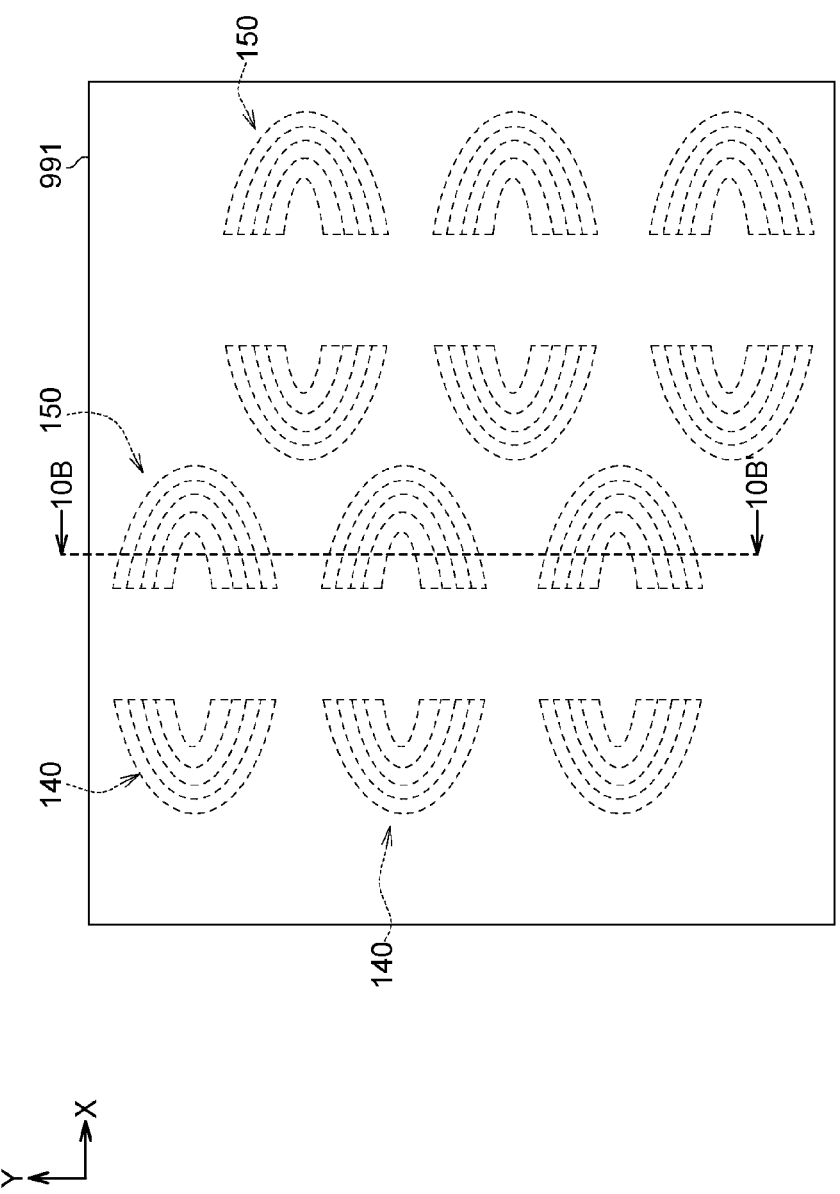
Figure 10B:
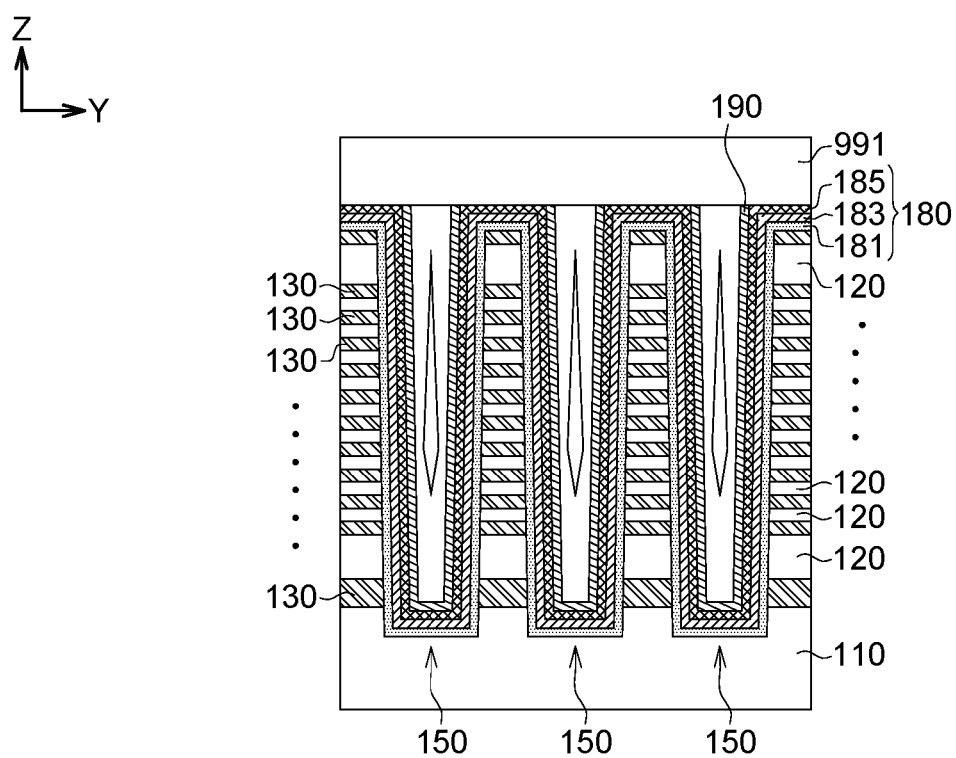

As shown in FIGS. 10A-10B, an isolating material layer 991 is formed on the first memory structures 140 and the second memory structures 150.

Figure 11A:
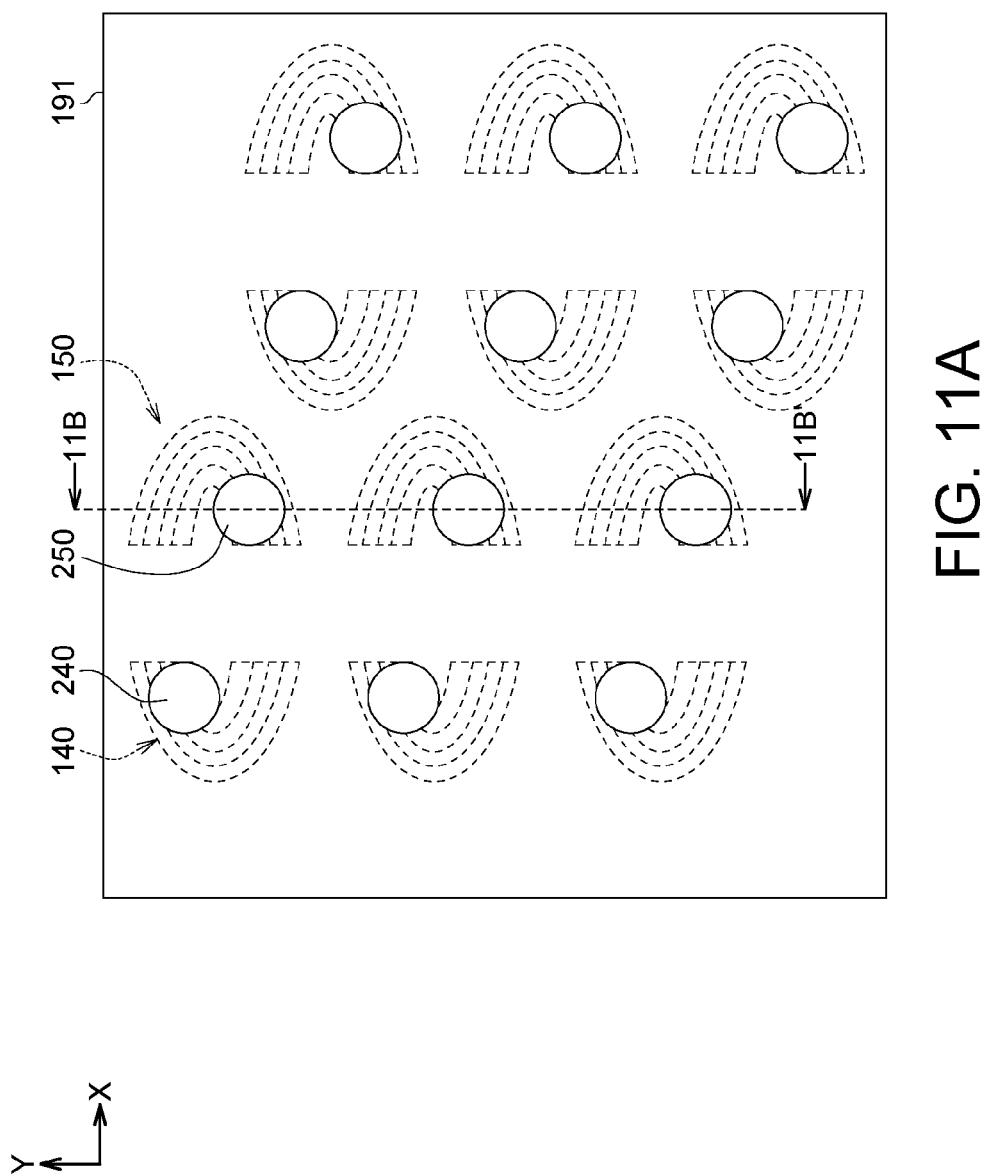
Figure 11B:
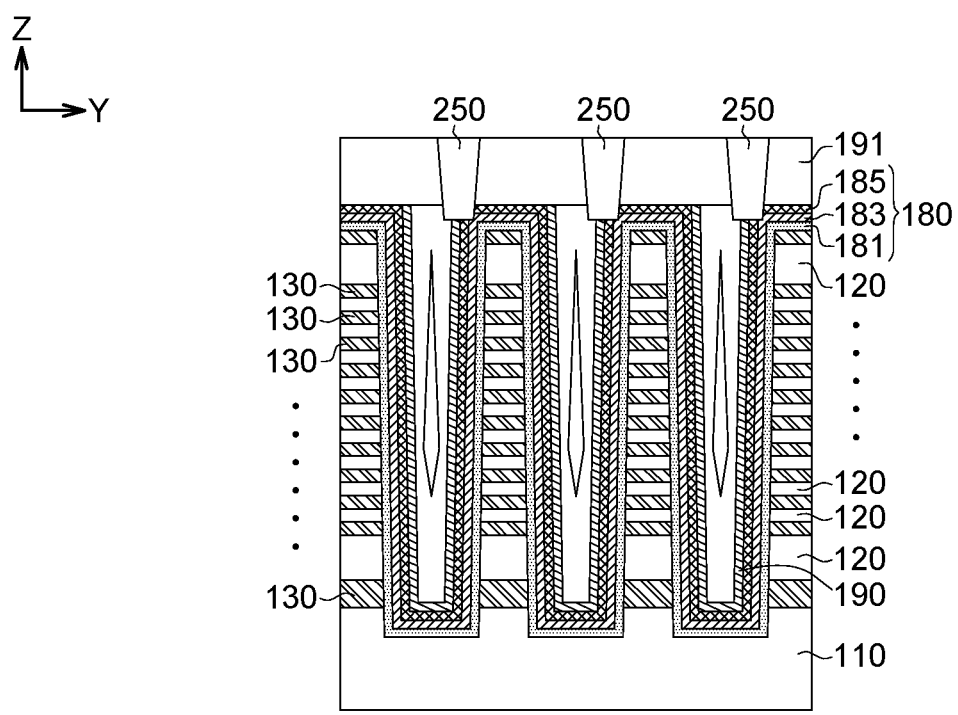

FIG. 11B is a cross-sectional view along the cross-sectional line 11B-11B' in FIG. 11A. As shown in FIGS. 11A-11B, a first contact structure 240 electrically connected to the first memory structure 140 is formed, and a second contact structure 250 electrically connected to the second memory structure 150 is formed. In the embodiment, for example, contact holes are formed in the isolating material layer 991, and then a conductive material is filled into the contact holes for forming the first contact structure 240 and the second contact structure 250 in the isolation layer 191.

Turning to FIGS. 12A to 12B, common source trenches (CSLs) are fabricated on semiconductor structure 100. These common source trenches (CSLs) run parallel with isolation trenches. In particular, FIG. 12A shows a top view of an example of a semiconductor structure 100 while FIG. 12B shows a cross-sectional view at the cross-sectional line A-A' on FIG. 12A. A gate replacement process is utilized to etch conducting layers 120 to form a space and fill the etched space with conducting metal, such as tungsten. In particular, the etching removes SiN from the space. Thereafter, a fill-in process is utilized to fill the space with a conducting metal, such as, for example, tungsten, followed up an etch-back process. After gate replacement, the common source trenches (CSLs) may be isolated from the conducting layers 120 and insulation layers so that tungsten fill-in process and a tungsten CMP (chemical mechanical polishing) process can be subsequently performed, as evidenced in FIG. 12B.

Referring to FIGS. 13A to 13B, bit lines may be formed on semiconductor structure 100 next. In particular, FIG. 13A shows a top view of an example of a semiconductor structure 100 while FIG. 13B shows a cross-sectional view at the cross-sectional line A-A' on FIG. 13A. Bit lines are formed on semiconductor structure 100 to form a first group of bit lines (BL1) and a second group of bit lines (BL2). The first group of bit lines BL1 connect first contacts 240 created on first group of semiconductor structures 140 while the second group of bit lines BL2 connect second contacts 250 created on second group of semiconductor structures 250.

The result of constructing bit lines on semiconductor structure 100 is also reflected in FIGS. 1A-1E. There, the isolation layer 193 is formed on the isolation layer 191, and the first bit line BL1 and the second bit line BL2 are formed in the isolation layer 193. The first bit line BL1 is electrically connected to the first contact structure 240, and the second bit line BL2 is electrically connected to the second contact structure 250. As such, the semiconductor structure 100 as shown in FIGS. 1A-1E is formed.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
    a substrate;
    a plurality of conductive layers and a plurality of insulating layers formed on the substrate, wherein the conductive layers and the insulating layers are interlaced and stacked on the substrate;
    a structure comprising: a first group of memory structure clusters and a second group of memory structure clusters, formed on the substrate and through the conductive layers and the insulating layers, each of the first group of memory structure clusters including a plurality of first memory structures, each first memory structure having a first cross-section shape, each of the second group of memory structure clusters including a plurality of second memory structures, each second memory structure having a second cross-section shape, the first cross-section shape and the second cross-section shape complementing each other;
    a plurality of isolation trenches formed on the substrate, each isolation trench disposed between a corresponding first memory structure cluster and a corresponding second memory structure cluster such that neighboring isolation trenches on the substrate are separated by a gap that is aligned with an axial direction of the neighboring isolation trenches; and
    a plurality of common source trenches formed on the substrate that run substantially parallel with the isolation trenches,
    wherein each first memory structure cluster and each second memory structure cluster has a C-shaped cross section, and wherein each first memory structure cluster and a second memory structure cluster are bilaterally symmetric with respect to an associated isolation trench.

2. The semiconductor structure according to claim 1, wherein the conductive layers comprise replacement gates with a conducting metal fill-in.

3. The semiconductor structure according to claim 1, further comprising:
    epitaxial structures, each epitaxial structure formed vertically between an isolation trench and the substrate such that a corresponding first memory structure and a corresponding second memory structure are electrically connected to the substrate via the epitaxial structure.

4. The semiconductor structure according to claim 1, wherein each of the first memory structures and each of the second memory structures respectively comprise:
    a memory structure layer, comprising:
        a blocking layer formed on the conductive layers;
        a memory storage layer formed on the blocking layer; and a tunneling layer formed on the memory storage layer; and a channel layer formed on the memory structure layer, wherein the channel layer is a polysilicon layer.

5. The semiconductor structure according to claim 1, wherein each memory structure cluster is a vertical memory structure cluster that comprises one to four memory structures, and wherein each memory structure is a vertical memory structure.

6. The semiconductor structure according to claim 1, wherein each first memory structure cluster has a C-shaped cross section, wherein each first memory structure cluster and a second memory structure cluster are bilaterally symmetric with respect to an associated isolation trench, wherein each second memory structure cluster has a C-shaped cross section, and wherein each second memory structure cluster and a first memory structure cluster are bilaterally symmetric with respect to an associated isolation trench.

7. The semiconductor structure according to claim 1, further comprising:
   first contact structures, each electrically connected to a corresponding first memory structure; and
   second contact structures, each electrically connected to a corresponding second memory structure.

8. The semiconductor structure according to claim 7, further comprising:
   first bit lines electrically connected to the first contact structures; and
   second bit lines electrically connected to the second contact structures, wherein the first bit lines and the second bit lines are substantially parallel to each other while the first bit lines and the second bit lines are substantially orthogonal to the common source trenches.

9. The semiconductor structure according to claim 8, wherein the first bit lines are electrically coupled to the common source trenches while the second bit lines are electrically coupled to the common source trenches.

10. A manufacturing method of a semiconductor structure, comprising:
   forming a plurality of conductive layers and a plurality of insulating layers on a substrate, wherein the conductive layers and the insulating layers are interlaced and stacked on the substrate;
   forming a structure comprising: a first group of memory structure clusters and a second group of memory structure clusters, each being formed on the substrate and through the conductive layers and the insulating layers, each of the first group of memory structure clusters including a first number of first memory structures, each first memory structure having a first cross-section shape, each of the second group of memory structure clusters including a second number of second memory structures, each second memory structure having a second cross-section shape, the first cross-section shape and the second cross-section shape complementing each other;
   forming a plurality of isolation trenches on the substrate, each isolation trench disposed between a corresponding first memory structure cluster and a corresponding second memory structure cluster such that neighboring isolation trenches on the substrate are separated by gaps that are aligned with an axial direction of the neighboring isolation trenches;
   forming a plurality of common source trenches on the substrate that run substantially parallel with the isolation trenches; and
   etching the conductive layers to form a space and filling the etched space with a conducting metal,
   wherein each first memory structure cluster and each second memory structure cluster has a C-shaped cross section, and wherein each first memory structure cluster and a second memory structure cluster are bilaterally symmetric with respect to an associated isolation trench.

11. The manufacturing method of the semiconductor structure according to claim 10, further comprising:
   forming epitaxial structures, each epitaxial structure being formed vertically between an isolation trench and the substrate such that a corresponding first memory structure and a corresponding second memory structure are electrically connected to the substrate via the epitaxial structure.

12. The manufacturing method of the semiconductor structure according to claim 10, wherein forming each first memory structure, each second memory structure, and each isolation trench comprises:
   forming a recess with an elliptical cross-section, the recess penetrating the conductive layers and the insulating layers as deep as the substrate;
   forming a memory structure material layer in the recess;
   forming a channel material layer on the memory structure material layer;
   forming an oxide material layer on the channel material layer to fill in the recess, the oxide material layer having an air gap;
   removing a portion of the conductive layers, a portion of the insulating layers, a portion of the memory structure material layer, a portion of the channel material layer, and a portion of the oxide material layer for forming a trench space; and
   filling the trench space with an isolation material such that an isolation trench is formed.

13. The manufacturing method of the semiconductor structure according to claim 12, wherein forming the trench space comprises:
   etching to remove the portion of the conductive layers, the portion of the insulating layers, the portion of the memory structure material layer, the portion of the channel material layer, and the portion of the oxide material layer such that the portion of the memory structure material layer, the portion of the channel material layer, and the portion of the oxide material layer in the recess are removed to expose the substrate, and the portion of the conductive layers and the portion of the insulating layers are removed to expose a bottommost layer of the insulating layers.

14. The manufacturing method of the semiconductor structure according to claim 12, further comprising:
   forming epitaxial structures, each epitaxial structure being formed vertically between an isolation trench and the substrate such that a corresponding first memory structure and a corresponding second memory structure are electrically connected to the substrate via the epitaxial structure.

15. The manufacturing method of the semiconductor structure according to claim 12, further comprising:
   removing the channel material layer exposed outside the trench space by a chemical mechanical polishing (CMP) process.

16. The manufacturing method of the semiconductor structure according to claim 10, further comprising:
   forming first contact structures, each electrically connected to a corresponding first memory structure; and forming second contact structures, each electrically connected to a corresponding second memory structure.

17. The manufacturing method of the semiconductor structure according to claim 16, further comprising:
    forming a first bit line electrically connected to the first contact structure; and
    forming a second bit line electrically connected to the second contact structure, wherein the first bit line and the second bit line are substantially parallel to each other while the first bit line and the second bit line are substantially orthogonal to the common source trenches.

18. The manufacturing method of claim 10, wherein the first number is in a range of one to four, and the second number is in a range of one to four.

* * * * *